(12) United States Patent
Inukai

(10) Patent No.: US 9,117,913 B2
(45) Date of Patent: *Aug. 25, 2015

(54) SEMICONDUCTOR ELEMENT, ELECTRIC CIRCUIT, DISPLAY DEVICE AND LIGHT-EMITTING DEVICE

(75) Inventor: Kazutaka Inukai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 320 days.

This patent is subject to a terminal disclaimer.

(21) Appl. No.: 12/627,429

(22) Filed: Nov. 30, 2009

(65) Prior Publication Data

US 2010/0073352 A1    Mar. 25, 2010

Related U.S. Application Data

(62) Division of application No. 10/289,355, filed on Nov. 7, 2002, now Pat. No. 7,629,611.

(30) Foreign Application Priority Data

Nov. 9, 2001 (JP) ................................. 2001-345273

(51) Int. Cl.
  *H01L 29/04* (2006.01)
  *H01L 31/036* (2006.01)
  (Continued)

(52) U.S. Cl.
  CPC ...... *H01L 29/78621* (2013.01); *H01L 27/1214* (2013.01); *H01L 29/42384* (2013.01);
  (Continued)

(58) Field of Classification Search
  CPC ............. H01L 27/3244; H01L 27/1214; H01L 29/78696; H01L 29/42384; H01L 29/78645; H01L 29/4908; H01L 27/1255; H01L 27/124; H01L 27/156; H01L 29/78618
  USPC .............. 257/59, 72, 344, 347, E27.131–132, 257/E27.152; 345/76, 82, 92
  See application file for complete search history.

(56) References Cited

U.S. PATENT DOCUMENTS 4,219,828 A    8/1980    Lardy et al.
4,917,467 A    4/1990    Chen et al.
(Continued)

FOREIGN PATENT DOCUMENTS

EP    0 403 267 A2    12/1990
EP    0816903 A    1/1998
(Continued)

OTHER PUBLICATIONS

Tsutsui et al.; "High Quantum Efficiency in Organic Light-Emitting Devices with Iridium-Complex as a Triplet Emissive Center"; Jpn. J. Appl. Phys., Japanese Journal of Applied Physics; Dec. 1999; pp. L1502-L1504; vol. 38, No. 12B.

(Continued)

*Primary Examiner* — Shouxiang Hu
(74) *Attorney, Agent, or Firm* — Nixon Peabody LLC; Jeffrey L. Costellia

(57) ABSTRACT

A current storing circuit capable of having a small area, a simple structure with the small number of devices, a low consumption current operation and high yield in manufacturing is provided. Applying the current storing circuit to the current-driving type of display device such as an OLED display device can improve the aperture rate of pixels and reliability of the display device as well as highly functionalize the display device. The invention is characterized by using a new semiconductor element in a shape of a transistor having plural drains or sources. When the semiconductor elements is used for both of a writing element and a driving element, reading in and storing a current value and outputting the current can be performed by only the two semiconductor elements, so that the area occupied by the devices would be easily reduced significantly.

15 Claims, 18 Drawing Sheets

(51) Int. Cl.
H01L 31/20 (2006.01)
H01L 29/786 (2006.01)
H01L 27/12 (2006.01)
H01L 29/423 (2006.01)
H01L 29/49 (2006.01)
H01L 29/66 (2006.01)
H01L 27/32 (2006.01)

(52) U.S. Cl.
CPC ...... *H01L29/4908* (2013.01); *H01L 29/66757* (2013.01); *H01L 29/78645* (2013.01); *H01L 29/78696* (2013.01); H01L 27/3244 (2013.01); H01L 2029/7863 (2013.01)

(56) References Cited

U.S. PATENT DOCUMENTS

| | | |
|---|---|---|
| 5,198,379 A | 3/1993 | Adan |
| 5,258,325 A | 11/1993 | Spitzer et al. |
| 5,331,192 A | 7/1994 | Kudoh |
| 5,349,366 A | 9/1994 | Yamazaki et al. |
| 5,637,899 A | 6/1997 | Eimori et al. |
| 5,930,632 A | 7/1999 | Gardner et al. |
| 5,986,306 A | 11/1999 | Nakajima et al. |
| 6,020,598 A | 2/2000 | Yamazaki |
| 6,104,040 A | 8/2000 | Kawachi et al. |
| 6,174,757 B1 | 1/2001 | Yamaguchi et al. |
| 6,246,180 B1 | 6/2001 | Nishigaki |
| 6,310,363 B1 | 10/2001 | Ohnuma et al. |
| 6,373,454 B1 | 4/2002 | Knapp et al. |
| 6,501,448 B1 | 12/2002 | Komiya et al. |
| 6,501,466 B1 | 12/2002 | Yamagishi et al. |
| 6,583,775 B1 | 6/2003 | Sekiya et al. |
| 6,812,489 B2 | 11/2004 | Kawachi et al. |
| 7,102,161 B2 | 9/2006 | Inukai |
| 7,629,611 B2 * | 12/2009 | Inukai ............................ 257/72 |
| 2001/0030719 A1 | 10/2001 | Yamaguchi et al. |
| 2001/0033252 A1 * | 10/2001 | Yamazaki et al. ................. 345/7 |
| 2002/0047581 A1 | 4/2002 | Koyama |
| 2002/0047852 A1 | 4/2002 | Inukai et al. |
| 2002/0086180 A1 | 7/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2003/0015960 A1 | 1/2003 | Seo et al. |
| 2003/0066740 A1 | 4/2003 | Inukai |
| 2003/0089910 A1 | 5/2003 | Inukai |
| 2003/0122140 A1 | 7/2003 | Yamazaki et al. |
| 2003/0184505 A1 | 10/2003 | Inukai et al. |
| 2004/0012026 A1 | 1/2004 | Seo et al. |
| 2004/0056257 A1 | 3/2004 | Sakamoto et al. |

FOREIGN PATENT DOCUMENTS

| | | |
|---|---|---|
| EP | 1 094 436 A2 | 4/2001 |
| EP | 1 102 234 A2 | 5/2001 |
| EP | 1 103 946 A2 | 5/2001 |
| JP | 60-241266 | 11/1985 |
| JP | 61-290767 | 12/1986 |
| JP | 03-087071 | 4/1991 |
| JP | 04-092475 | 3/1992 |
| JP | 04-118964 | 4/1992 |
| JP | 04-267551 | 9/1992 |
| JP | 05-235339 | 9/1993 |
| JP | 07-106581 | 4/1995 |
| JP | 07-504782 | 5/1995 |
| JP | 07-263703 | 10/1995 |
| JP | 07-321033 | 12/1995 |
| JP | 09-319323 | 12/1997 |
| JP | 10-073845 A | 3/1998 |
| JP | 2000-187243 A | 7/2000 |
| JP | 2000-221903 A | 8/2000 |
| JP | 2000-235370 | 8/2000 |
| JP | 2000-347621 | 12/2000 |
| JP | 2001-056667 A | 2/2001 |
| JP | 2001-147659 | 5/2001 |
| JP | 2001-222255 | 8/2001 |
| JP | 2001-296553 | 10/2001 |
| JP | 2001-343933 | 12/2001 |
| JP | 2002-149113 | 5/2002 |
| JP | 2003-059666 | 2/2003 |
| JP | 2003-152185 A | 5/2003 |
| JP | 2004-004348 | 1/2004 |
| WO | WO-93/16491 | 8/1993 |
| WO | WO-99/65011 | 12/1999 |

OTHER PUBLICATIONS

"Chinese Office Action (Application No. 200910176350.2; CN06066D1) Dated May 17, 2011".

Office Action (Application No. 200210039971.9; CN6066) dated May 9, 2008 with an English translation.

Baldo et al.; "*Very high-efficiency green organic light-emitting devices based on electrophosphorescence*"; Applied Physics Letters; Jul. 5, 1999; pp. 4-6; vol. 75, No. 1.

Tsutsui et al.; "*High Quantum Efficiency in Organic Light-Emitting Devices with Iridium-Complex as a Triplet Emissive Center*"; Jpn. J. Appl. Phys., Japanese Journal of Applied Physics; Dec. 1999; pp. L1502-L1504; vol. 38.

Baldo et al.; "*Highly efficient phosphorescent emission from organic electroluminescent devices*"; Nature vol. 395; Sep. 10, 1998; pp. 151-154.

Tsutsui et al.; "*Electroluminescence in Organic Thin Films*"; Photochemical Processes in Organized Molecular Systems; 1991; pp. 437-450.

* cited by examiner

Fig.4A WRITING PERIOD Ta
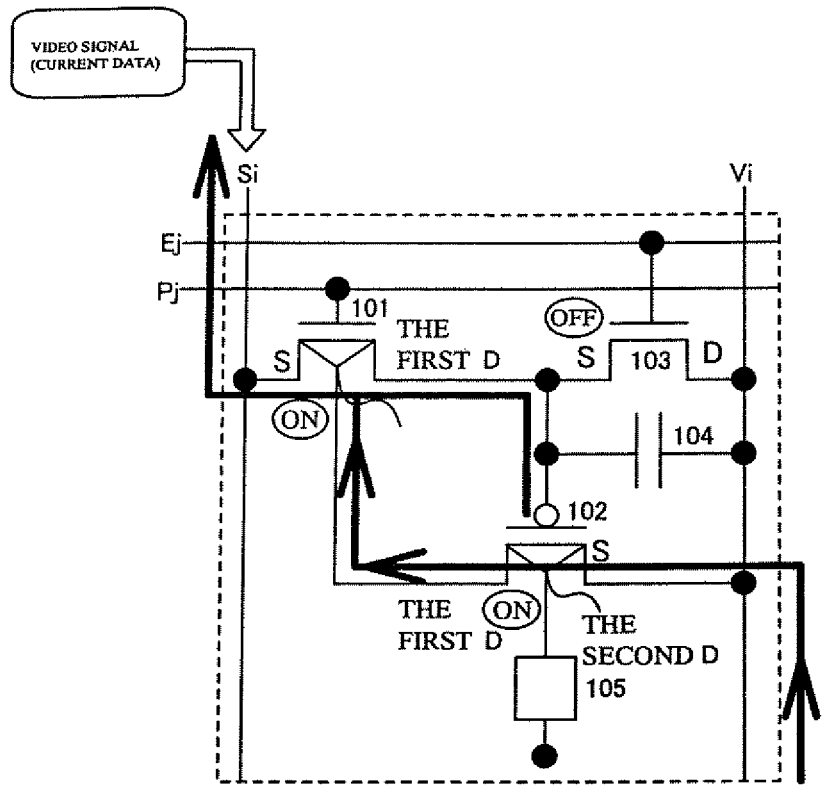
Fig.4B DISPLAYING PERIOD Td
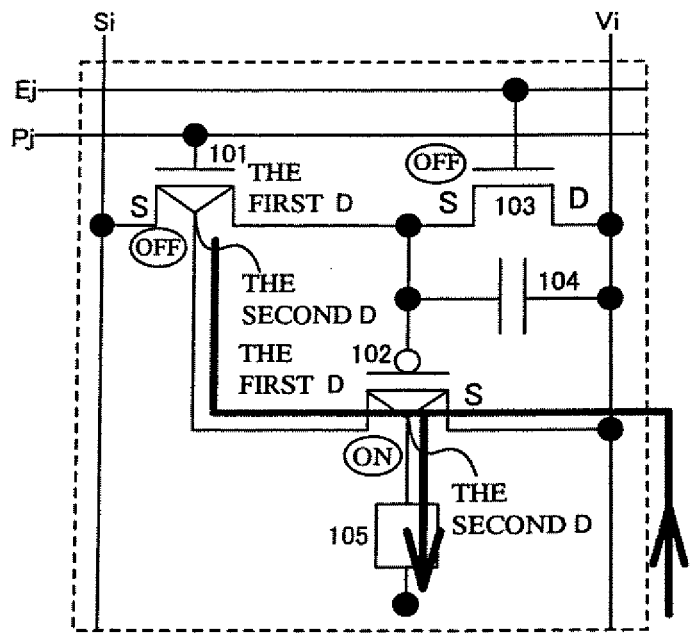

TO THE SOURCE SIGNAL LINE

TO THE SOURCE SIGNAL LINE

TO THE WRITING GATE SIGNAL LINE

TO THE INITIALIZING GATE SIGNAL LINE

A○  ○C
  3001  3002
    ○
    B

PRIOR ART

SEMICONDUCTOR ELEMENT, ELECTRIC CIRCUIT, DISPLAY DEVICE AND LIGHT-EMITTING DEVICE

BACKGROUND OF THE INVENTION

1. Field of the Invention

The present invention relates to a configuration of a semiconductor element including a field-effect transistor type and an electric circuit using the semiconductor element. Further, the present invention relates to a light emitting device wherein a light emitting element and the semiconductor element controlling the light emitting element are provided on the light emitting device. Or, the present invention relates to a display device. Moreover, the present invention relates to an electronic apparatus on which the light emitting device and the display device are mounted.

2. Description of the Related Art

In recent years, the importance of a light emitting device displaying images is increased. As the display device, a liquid crystal display device displaying images by using a liquid crystal element is widely used as a display device for various kinds of uses including a cellular phone, a personal computer and the like by utilizing the advantages of the liquid crystal display device such as high picture quality, thinness and light-weight.

On the other hands, the development of a light emitting device and a light emitting display device using a light emitting element which serves as a self-luminous element has also been advanced. Such self-luminous element includes various kinds of elements in the widely range of an organic material, an inorganic material, a thin film material, a bulk material, and a dispersion material.

Especially, a representative self-luminous element is an organic light emitting diode (OLED) element. An OLED display device using the OLED element as a light emitting element has, in addition to features that the OLED display device is thinner and lighter than the conventional liquid crystal display devices, new features such as a first response speed, a wide viewing angle and a low voltage drive which are suitable for an animation display. Therefore, the OLED display device is drawing attention as the next-generation display device since the OLED display device is considered wide range of uses such as a cellular phone, a portable information terminal (PDA: personal digital assistant), television, and a monitor.

In particular, an active matrix (AM) type OLED display device can provide a high definition display in a large size screen, which is difficult to a passive matrix (PM) type OLED display device. Furthermore, the AM type OLED display device operates at lower power consumption than the PM type OLED display device, and has a high reliability. Thus, the AM type OLED display device is expected to be implemented.

One of various conditions necessary for putting a light-emitting device such as an OLED display device into practice is to maintain the luminous intensity almost constant. Especially an OLED device has a problem that the luminous intensity greatly depends on ambient temperature. In many OLED devices, the amount of the current increases in high temperature under the condition that the voltage is constant. The greater the amount of the current flowing to the OLED device is, the higher the intensity of the OLED device becomes.

Then, the OLED light-emitting device would be unstable and very bad for usage such that the display of the whole screen changes in brightness in accordance with the change of temperature.

There is also a problem that an existing OLED device generally tends to be decreased, as the time elapses, in the luminous intensity due to light emission. This is a fairly serious problem although the degree of decrease of the luminous intensity is broad depending on the structure of the OLED device.

When the luminous intensity decreases as the time elapses due to the amount of light emission and thereby the luminous intensity cannot be maintained almost constant, the display of a light-emitting device is not only unstable in the brightness as a whole but also has a problem in displaying gradation in each pixel. For example, displaying in respective pixels in a screen of a static image having significant difference in the luminous intensity over a long time causes burning of an image, which becomes so ugly in appearance.

Especially in the case of an OLED display device for displaying a color image by means of three kinds of luminous element corresponding to R (red), G (green) and B (blue), used generally "a triple color painting method" in which an OLED device to be used is different by a color, from the view of high efficiency and low consumption current in emitting a light. Then, color shift occurs since the temperature dependency of the luminous intensity is different by a color. Otherwise, color shift between the displaying colors in a light-emitting device occurs because the luminous intensity of respective OLED devices, decrease at a different speed corresponding to every color as the time elapse.

The decrease of the luminous intensity of an OLED device in elapse of time becomes larger in the ease that the voltage applied to the OLED device is constant (constant voltage-driving) than the case that the current flowing to the OLED device is constant (constant current-driving). The reason is as follows.

It is said that the luminous intensity L of an OLED device is generally proportional to the amount of the current flowing to the OLED device I (V). When the proportional constant is c (V), there is a relation expressed by $L = c(V) I(V)$, wherein V is the applied voltage to the OLED device necessary for emitting a light at the intensity L.

Continuous emission of a light by an OLED device, however, gradually decreases both of c (V) and I (V). Here, in the case of constant voltage-driving of a OLED device, the decrease of the both of c (V) and I (V) is reflected to that of L. On the other hand, in the case of constant current-driving of an OLED device, the decrease of c (V) is only reflected to that of L. Therefore, the decrease of L is larger in comparison in the constant voltage-driving than in the constant current-driving.

As a background of the decrease of c (V), an OLED device originally has little resistance against moisture, oxygen, light and heat, and thereby, change of characteristics and deterioration of the device per se tend to start or be facilitated easily. However, the progressing speed of the deterioration of the device greatly depends on the kind of a luminous material, the material of an electrode, the structure of a device driving the light-emitting device, the manufacturing circumstance and the manufacturing conditions. Improving the above, therefore, can restrain to a certain degree the decrease of c (V) in elapse of time.

Further, the temperature dependency of the luminous intensity of an OLED device is significantly high in the constant voltage-driving whereas that is often low in the constant current-driving. This can be considered that I (V) has high temperature dependency while c (V) has little temperature dependency under a condition of $1 = c(V) I(V)$.

In view of the above, gradation display by current-driving rather than the voltage-driving of a luminous element of an OLED light-emitting device must enable the luminous element to maintain the almost constant intensity without greatly decreasing the luminous intensity in the elapse of time and without depending on the change of ambient temperature.

In the case of luminous elements other than the OLED device, the temperature dependency is also low in the constant current-driving rather than in the constant voltage-driving, generally, although it also depends on the kind of the device. From this point of view, the constant current-driving is still more preferable.

In a light-emitting device such as an AM-type of OLED display device, the current-driving of a luminous element is possible by mounting a current storing circuit on a pixel. The current storing circuit to be mounted on a pixel can be produced by means of an active element such as a thin film transistor (TFT).

Not only the current storing circuit but a circuit in a pixel is generally preferable to have a structure as simple as possible from a view of reduction of a manufacturing cost and lowering of the defective rate.

Moreover, the area occupied by a circuit is preferably as small as possible since improvement of the luminous area rate (the aperture rate) is strongly required in order to save power and stabilize emission of a light. The small luminous area rate, however, requires the luminous element to emit a light at the high current density for the purpose of obtaining the predetermined intensity, so that the luminous element would be easily facilitated to be changed in characteristics and deteriorate.

The most direct and effective method for improving the luminous area rate (the aperture rate) is to mount a circuit in a pixel on the side opposite to the direction of light-emission. This method, however, is not an effective solution in practice since it is better to mount a circuit in a pixel on the same side as the direction of light-emission in order to stably produce an OLED device.

Another reason why the small circuit area is preferable is that it is possible to highly integrate a pixel circuit for high functionalization.

SUMMARY OF THE INVENTION

In view of the above, an object of the invention is to provide a light-emitting device with a simple structure in which a luminous element can maintain an almost constant intensity without depending on ambient temperature and without greatly decreasing the luminous intensity as the time elapses. Another object of the invention is to provide a light-emitting device with a simple structure in which desired color display is possible without any color shift. Yet another object of the invention is to provide a structure of a semiconductor element available to put the above-mentioned light-emitting device into practice and an electric circuit using the semiconductor element.

In the invention, a luminous element, a driving element for controlling the luminous element and a writing element are first provided. The elements other than the luminous element are generally formed by means of a TFT, which is, however, disadvantageous since the number of TFT increases and the circuit area including wiring thereby increases. In the invention, the circuit is simplified and reduced in the area by using the following new device.

The above-mentioned new element is in a shape of a transistor having a plurality of drains and is referred to as a multi-drain transistor in this specification. The multi-drain transistor is, in other words, a semiconductor element having a gate electrode and at least three impurity regions.

More particularly, it can be said that the multi-drain transistor is a semiconductor element, which has a semiconductor layer, a gate insulating film formed so as to cover the semiconductor layer and a gate electrode contacting with the gate insulating film, the semiconductor layer having a channel forming region and at least three impurity doped source or drain regions, the channel forming region and the gate electrode sandwiching the gate insulating film therebetween and overlapping each other, and said at least three impurity regions contacting with the channel forming region. It is assumed here that one of the impurity regions is a source and the others are drains.

It should be noted that in some cases the multi-drain transistor is properly referred to as a multi-source transistor or a multi-source multi-drain transistor in accordance with the way of use. Generally, a source and a drain of a transistor (especially a TFT) are often same in structure and cannot be necessarily discriminated apparently. The above-mentioned device is therefore collectively called a multi-drain transistor here, including a multi-source transistor and a multi-source multi-drain transistor.

The shape, including the size and symmetry, of a multi-drain transistor is not especially limited. A semiconductor used for producing a multi-drain transistor may be in any form such as a composition material, bulk, a non-crystal (amorphous) thin film and a polycrystalline (poly-) film.

It is most practical at present to use a thin film semiconductor made of polycrystalline silicon (poly-silicon) for a driving element for controlling a luminous element. The channel type, including with or without symmetry, of respective drains and sources of a multi-drain transistor is also not especially limited.

The invention further provides an electric circuit using a writing element and a driving element. A multi-drain transistor is used in one or both of the writing and driving elements. The invention having such structure contributes to simplification, reduction in the area and high integration of a circuit requiring a current storing function.

The invention also provides a display device having a pixel provided with a current-driving type of displaying element, the above pixel comprising a writing element for selecting input of a video signal in a form of a current value for the pixel and a driving element for controlling the amount of electric current flowing to the displaying element, wherein a semiconductor element is used in at least one of the writing element and the driving element. The invention is especially effective when the displaying element has a characteristic that its resistant value changes in accordance with the change in temperature or time. That is, the value of the current flowing to the displaying element can be kept constant without depending on the change in temperature or time, so that the intensity can be kept good. It is most effective that the displaying element is a luminous element since the luminous element has a characteristic of depending on the change in temperature or time.

A multi-drain transistor having two drains is particularly referred to as a double drain transistor. The invention will be described mainly with reference to an example of a pixel circuit having a current storing function, in which a double drain transistor of a poly-silicon thin film is used.

BRIEF DESCRIPTION OF THE DRAWINGS

Other features and advantages of the present invention will appear more clearly upon reading the following detailed description, made with reference to the annexed drawings in which:

FIG. 4A is a schematic view of a pixel during a writing period and FIG. 4B is a schematic view of a display period;

DESCRIPTION OF THE PREFERRED EMBODIMENTS

Embodiment Mode 1

Figure 2:
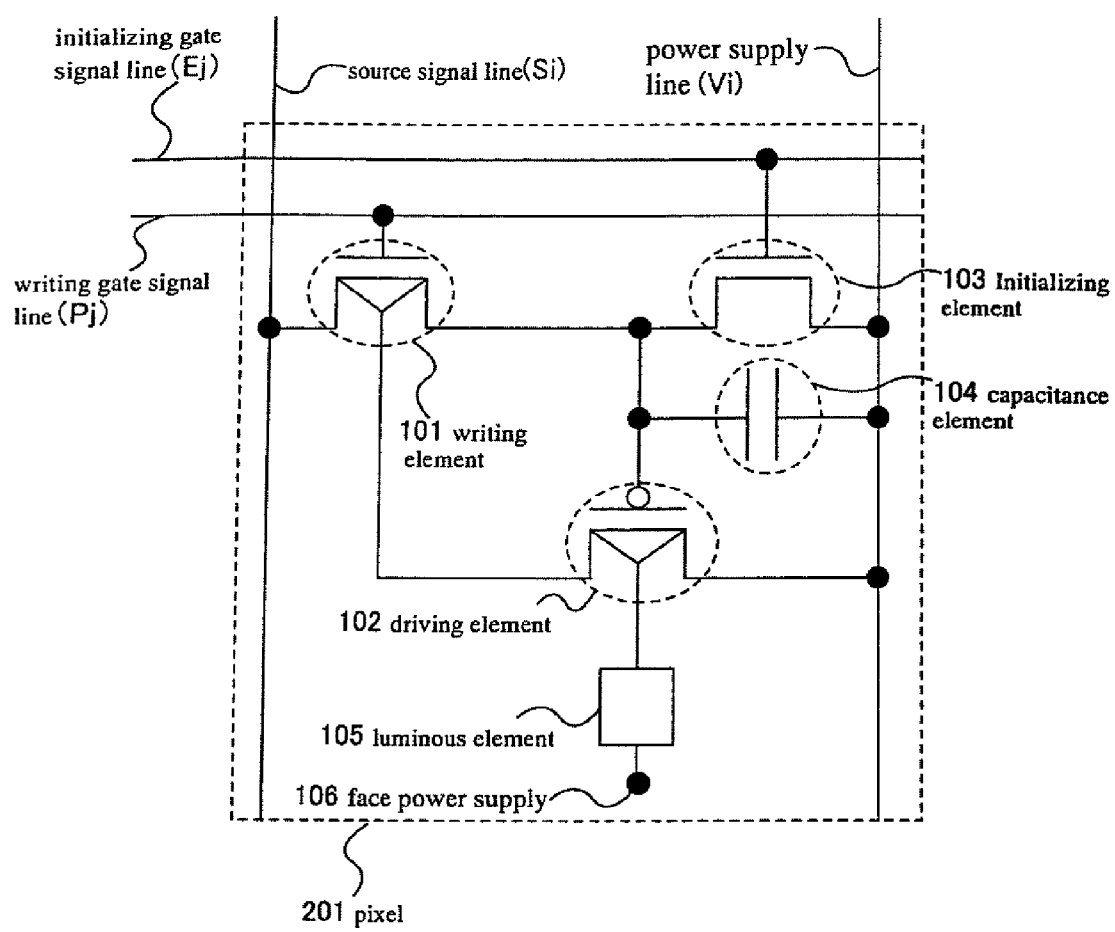
FIG. 2 illustrates an example of a pixel circuit of a light-emitting device according to the invention.

FIG. 2 shows an example of a pixel circuit with a current storing function in a light-emitting device according to the invention.

A pixel 201 shown in FIG. 2 has a source signal line Si (one of S1 to Sx), a writing gate signal line Pj (one of P1 to Py), an initializing gate signal line Ej (one of E1 to Ey) and a power supply line Vi (one of V1 to Vx). The pixel 201 also has a writing element 101, a driving element 102, an initializing element 103, a capacitance element 104 and a luminous element 105.

The initializing element 103 is added in FIG. 2 because of its utility although not necessarily required to the invention. In some cases, the capacitance element 104 can be substituted by such as a parasitic capacity without being provided explicitly.

An element or a circuit may be attached, if necessary, other than the driving element, the writing element, the initializing element, the capacitance element and the luminous element.

Figure 15:
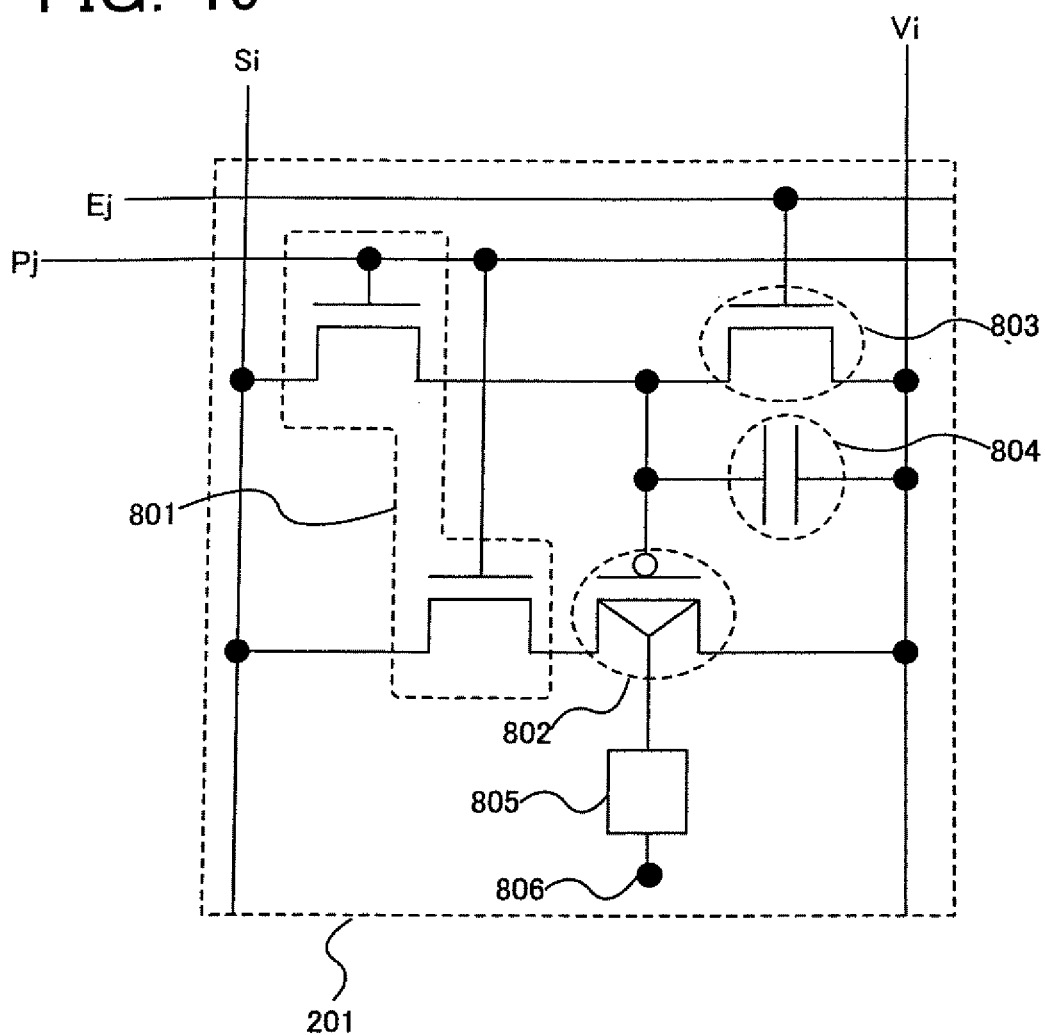
FIG. 15 shows an example of a pixel circuit of a light-emitting device according to the invention.

In the invention, at least one of the driving element and the writing element is a multi-drain transistor. The both of them, however, may not be necessarily multi-drain transistors, and one of them may be an ordinary transistor (which is referred to as a single drain transistor hereinafter in the case that the discrimination is especially required). FIG. 15 shows an example in which only a driving element is a multi-drain transistor.

In FIG. 2, double drain transistors is used for both of the driving element and the writing element. Any one of drains of a double drain transistor is referred to as a first drain while the other is referred to as a second drain for the purpose of discrimination. It is not defined which drain is referred to as the first drain and which drain is referred to as the second drain. The first and second drains can be optionally and individually designated. It is sometimes difficult to discriminate among the source, the first drain and the second drain, depending on a way for using. In such a case, the first and second drains including the source are optionally designated.

The length and the width of each channel portion communicating with the source, the first drain and the second drain in a double drain transistor may all be optional and not be necessary to be equal or symmetrical. The channels are referred to as a source channel, a first drain channel and a second drain channel, respectively, hereinafter. These three channels are simply referred to as whole channels of a double transistor, collectively. The length and the width of each channel can be optionally determined in accordance with a purpose of use.

In this embodiment mode, all channels of a double drain transistor of the writing element 101 (simply referred to as a writing element, hereinafter) are of an n-type, all channels of a double drain transistor of the driving element 102 (simply referred to as a driving element, hereinafter) are of a p-type and a channel of the initializing element 103 is of the n-type. The writing element 101 and the initializing element 103 may be of the p-channel type. Furthermore, the all channels of the driving element 102 may be of the n-type. Moreover, all channels of a double transistor per se may not necessarily of a same type, originally.

The double drain transistor can control the connection of three nodes by means of voltage applied to a gate electrode. A gate electrode of the writing element 101 is connected to a writing gate signal line Pj. The source, the first drain and the second drain of the writing element 101 are connected to a source signal line Si, a drain of the initializing element 103 and the first drain of the driving element 102, respectively (refer to FIG. 4A). A switching element 101 has a function of controlling writing of a signal into a pixel 201.

A gate electrode of the driving element 102 is connected to a drain region of the initializing element 103. A source region, a first drain region and a second drain region of the driving element 102 are connected to a power supply line Vi, a second drain of the writing device 102 and a pixel electrode of the luminous element 105, respectively. The driving element 102 has a function of controlling the current flowing to the luminous element.

The luminous element 105 may be various kinds of device such as, for example, an OLED device, an inorganic light-emitting diode device, other light-emitting diode devices, an inorganic EL device, other solid luminous elements, an FED device and other vacuum luminous elements. An OLED device is used as the luminous element 105 in this embodiment mode. The OLED device has an anode, a cathode and an organic luminous layer sandwiched between the anode and the cathode.

In this embodiment mode, the anode of the OLED device 105 is used as a pixel electrode and the cathode is used as a counter electrode. It is generally preferable to use the anode as a pixel electrode and the cathode as a counter electrode when all channels of the driving element 102 are of the p-type.

On the contrary, it is preferable to use the cathode as a pixel electrode and the anode as a counter electrode in the case that all channels of the driving element 102 are of the n-type. The usage of the anode and the cathode is not limited to the and another way of use may be possible.

An OLED device 105 can be produced by using a known luminous material to form an organic luminous layer. The organic luminous layer has various kinds of structure such as a single layer structure, a laminated layer structure and an intermediate structure, either of which may be used for the invention so long as it is known. There are two kinds of luminescence in the organic luminous layer: luminescence (fluorescence) in returning from a single term excitation state to a base state; and luminescence (phosphorescence) in returning from a triple term excitation state to a base state. Both of the luminescence can be applied to the invention.

A gate electrode of the initializing element 103 is connected to an initializing gate signal line Ej. A source of the initializing element 103 is connected to a gate electrode of the driving element 102 and a drain is to the power supply line Vi.

One of two electrodes included in the capacitance element 104 is connected to the power supply line Vi while the other is connected to the gate of the driving element 102. More particularly, the two electrodes included in the capacitance element 104 are connected to the gate of the driving element 102 and the source of the driving element 102.

The voltage of the power supply line Vi (power supply voltage) and the voltage of the counter electrode are kept at constant values in this embodiment mode. This is for the purpose of simple description and not originally necessary. The power supply voltage can be changed so as to apply backward bias to the luminous element 105 for a certain period in order to improve reliability of the luminous element.

The pixel electrode is an anode of an OLED device in this embodiment mode, and therefore, the voltage of the counter electrode should be a predetermined value lower than the power supply voltage. In the case that the pixel electrode is a cathode of an OLED device, the voltage of the counter electrode should be a predetermined value higher than the power supply voltage.

Figure 1:
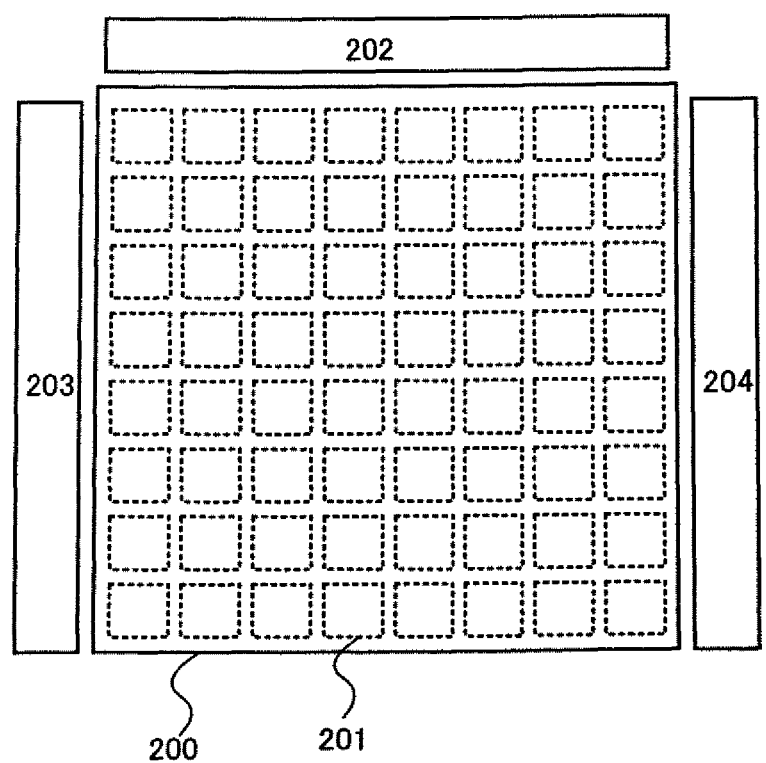
FIG. 1 is an example of a schematic structural view of a light-emitting device according to the invention.

FIG. 1 shows a schematic view of a whole structure of the light-emitting device according to the invention to which the pixel 201 shown in FIG. 2 is mounted. 200 denotes a pixel portion in which pixels with a circuit shown in FIG. 2 form a matrix. 202 denotes a source signal line driving circuit, 203 denotes a writing gate signal line driving circuit and 204 denotes an initializing gate signal line driving circuit.

There are a source signal line driving circuit 202, a writing gate signal line driving circuit 203 and an initializing gate signal line driving circuit 204 provided in ones in FIG. 1, but the invention is not limited to such a structure. It is possible to optionally set the number of the source signal line driving circuit 202, the writing gate signal line driving circuit 203 and the initializing gate signal line driving circuit 204 in accordance with the structure of the pixel 201. In the case of the structure that the pixels are provided with no initializing element 103 (FIG. 1), for example, the second writing gate signal line driving circuit 203 may be provided instead of the initializing gate signal line driving circuit 204.

The source signal line driving circuit 202, the writing gate signal line driving circuit 203 and the initializing gate signal line driving circuit 204 can be mounted on a sheet of a glass substrate by using a poly-silicon TFT. All or a part of them, however, may be formed on a substrate different from the pixel portion 200 (a chip, etc.) so as to be connected to the pixel portion 200 through a connector such as a FPC.

The pixel portion 200 is provided with the source signal lines S1 to Sx, the power supply lines V1 to Vx, the writing gate signal lines P1 to Py and the initializing gate signal lines E1 to Ey, although they are not shown in FIG. 1. The number of the source signal lines S1 to Sx is not necessarily same as that of the power supply lines V1 to Vx. The number of the writing gate signals P1 to Py is not necessarily same as that of the initializing gate signal lines E1 to Ey. Such wiring is not necessarily be all provided. The different wiring may be provided other than the wiring.

The power supply lines V1 to Vx are kept at a predetermined voltage. In this embodiment mode, a structure of a light-emitting device displaying a monochrome image is described, but the invention may be a light-emitting device displaying a color image. In the latter case, the height of the voltage of the power supply lines V1 to Vx all may not be kept at the same so as to change it by every color corresponding thereto.

Figure 3:
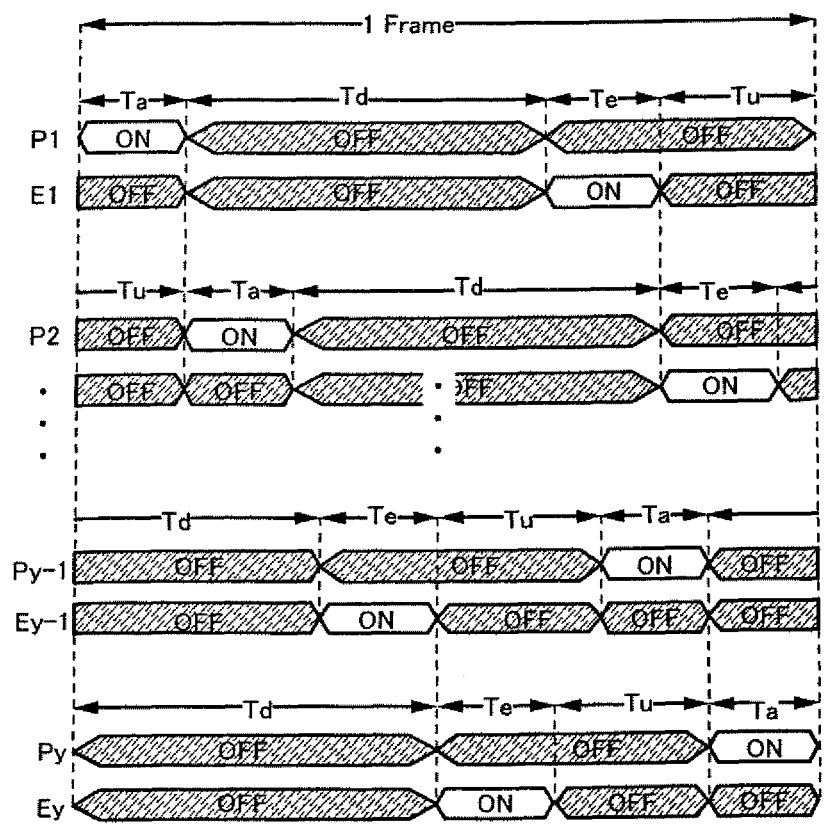
FIG. 3 shows a timing chart of a signal inputted to a gate signal line.

Next, a way of driving the above-mentioned light-emitting device according to the invention will be described, made with reference to FIGS. 3 and 4. An operation of the light-emitting device according to the invention can be divided by every pixel of each line into a writing period Ta, a displaying period Td, an initializing period Te and a non-displaying period Tu for the purpose of description. FIG. 3 shows a timing chart of a writing gate signal line and an initializing gate signal line. The writing gate signal line and the initializing gate signal are collectively referred to as a gate signal line in this specification. The period during which the gate signal line is selected, that is, which all of semiconductor elements having a gate electrode connected to the gate signal line are in the on state, is shown as ON. On the contrary, the period during which the gate signal line is not selected, that is, which all of semiconductor elements having a gate electrode connected to the gate signal line are in the off state, is shown as OFF.

FIG. 3 briefly shows a timing chart of the writing period Ta, the displaying period Td, the initializing period Te and the non-displaying period Tu for the pixel 201. There are discrimination between the writing period Ta and the displaying period Td and between the initializing period Te and the non-displaying period Tu in this embodiment mode, but the invention is not limited to the above. The initializing period Te may be included in the displaying period Td as well as the writing period Ta may be included in the non-displaying period Tu. FIG. 4A shows a way of current flow in the pixel 201 during the writing period Ta. FIG. 4B shows a way of current flow in the pixel 201 during the displaying period Td. The arrows shown in the pixel 201 indicate the direction of the flow.

First, upon starting the writing period Ta for a first line of pixel, the writing gate signal line P1 is selected so that the writing element 101 would turn on. The initializing element 103 is in the off state since an initializing gate signal line E1 is not selected at that time. Then, the current flows between the source signal lines S1 to Sx and the power supply lines V1 to Vx through the writing element 101 and the driving element 102 on the basis of a video signal inputted from the source signal line driving circuit 202 to the pixel 201.

The current flowing in the pixel 201 during the writing period Ta will be described in more detail with reference to FIG. 4A. A gate of the writing element 101 opens so as to turn the writing element 101 on when the writing gate signal line P1 is selected. A gate and a first drain of the driving element 102 are then short-circuited, which results in an operation of the portion of combination between the source channel and the first drain channel as a diode.

A source, an n-th drain, a channel portion (a source channel and the n-th drain channel) between the source and the n-th drain and a gate of a double drain transistor are hereinafter referred to as the n-th element transistor of the double drain transistor for convenience. A source, a first drain, a channel portion therebetween and a gate of the driving element 102 are referred to as the first element transistor of the driving element 102.

When the first element transistor of the driving element 102 operates as a diode, the video signal current inputted from the source signal line Si to the pixel 201 flows as it is to the power supply lines V1 to Vx through the writing element 101 and the first element transistor of the driving element 102. At the same time, the gate voltage of the first element transistor of the driving element 102, which corresponds to the video signal current inputted from the source signal line Si to the pixel 201, is accumulated in the capacitance element 104 through the writing element 101. The voltage accumulated in the capacitance element 104 is the voltage $V_{GS}$ between the gate and the source of the first element transistor of the driving element 102, and therefore, the first element transistor of the driving element 102 turns on in accordance with the voltage of the capacitance element 104.

The first element transistor of the driving element 102 operates in a saturable region during the writing period Ta since its gate and drain are connected to each other. Thus, when $V_{GS}$ is the voltage between the gate and the source, $\mu$ is the degree of movement, $C_o$ is the gate capacity per a unit area, W/L is the ratio of the channel width W and the channel length L in a channel forming region and $V_{TH}$ is the threshold, the drain current $I_{dn}$ of the first element transistor of the driving element 102 is expressed by the following formula:

$$I_{dn} = \mu C_o W/L (V_{GS} - V_{TH})^2/2.$$

In the above formula, all of $\mu$, $C_o$, W/L and $V_{TH}$ are fixed values determined in accordance with the individual element. Therefore, when $\mu$ and $V_{TH}$ are dispersed among the respective elements, the values of all the elements would not be always equal even in the case of $I_{dn}$ for the same $V_{GS}$. Maintaining the drain current of the first element transistor of the driving element 102 to be equal to the video signal current $I_{vd}$, however, can make $I_{dn}$ equal for all of the first element transistor of the driving element 102 regardless of dispersion of $\mu$ and $V_{TH}$.

The selection of the writing gate signal line P1 is completed upon the completion of the writing period Ta for the first line of pixel. The displaying period Td is then started. The writing element 101 is in the off state since the writing gate signal line P1 is not selected during the displaying period Td. The initializing element 103 is also in the off state since the initializing gate signal line E1 is not selected during the displaying period Td.

The flow of the current in the pixel 201 during the display period Td will be described with reference to FIG. 4B. $V_{GS}$ determined during the writing period Ta is held by the capacitance element 104 in the gate electrode of the driving element 102. The current, however, does not flow toward the first element transistor of the driving element 102 and flows to the luminous element through the second element transistor since the writing element 101 is in the off state during the displaying period Td.

The second element transistor of the driving element 102 operates in the saturated region. In order to satisfy such a condition, it is required to properly set in advance the video signal current $I_{VD}$ to be written into the pixel and the counter electrode voltage.

The drain current $I_{dn}$ of the second element transistor of the driving element 102 is expressed by $I_{dn} = \mu C_o$ W/L $(V_{GS} - V_{TH})^2/2$ because of the operation in the saturable region. In accordance with $I_{dn} = \mu C_o$ W/L $(V_{GS} - V_{TH})^2/2$, the drain current $I_{dn}$ must depend on the value of $\mu$, $V_{TH}$ or such. On the other hand, $V_{GS}$ is set in writing so that the drain current $I_{dn}$ of the first element transistor would be $I_{vd}$. Therefore, the dispersion of $\mu$, $V_{TH}$ and such between the second element transistors of the driving element 102 in each pixel is not reflected in the drain current $I_{dn}$ of the second element transistor when the values of $\mu$, $V_{TH}$ and such of the first element transistor and the second element transistor are equal in the driving element 102 in each pixel.

That is to say, the necessity for controlling the dispersion of $\mu$, $V_{TH}$ and such can be greatly reduced from the driving element 102 of pixels in a whole screen in the light-emitting device to a portion between the first element transistor and the second element transistor of the driving element 102 in each pixel. Furthermore, the dispersion of $\mu$, $V_{TH}$ and such of the first element transistor and the second element transistor is originally little in a double drain transistor.

Thus, the drain current $I_{dn}$ of the second element transistor of the driving element 102 appropriately corresponds to the video signal current $I_{vd}$ during the displaying period Td. Namely, the predetermined proper current flows from the power supply line Vi to the counter power supply of the luminous element 105 through the second element transistor of the driving element 102. The current appropriately flowing to the luminous element 105 results in light-emission of the luminous element 105 at an appropriate intensity. The luminous element 105 does not emit a light, of course, when the drain current $I_{dn}$ is zero.

The video signal current $I_{vd}$ should be an appropriate value of the current in principle. Exception is the case that the content of the video signal is the darkest gradation "non-lighting". In this case, the video signal is just required to turn off the element transistor of the driving element 102, so that the data of the current values would be enough.

Figure 16:
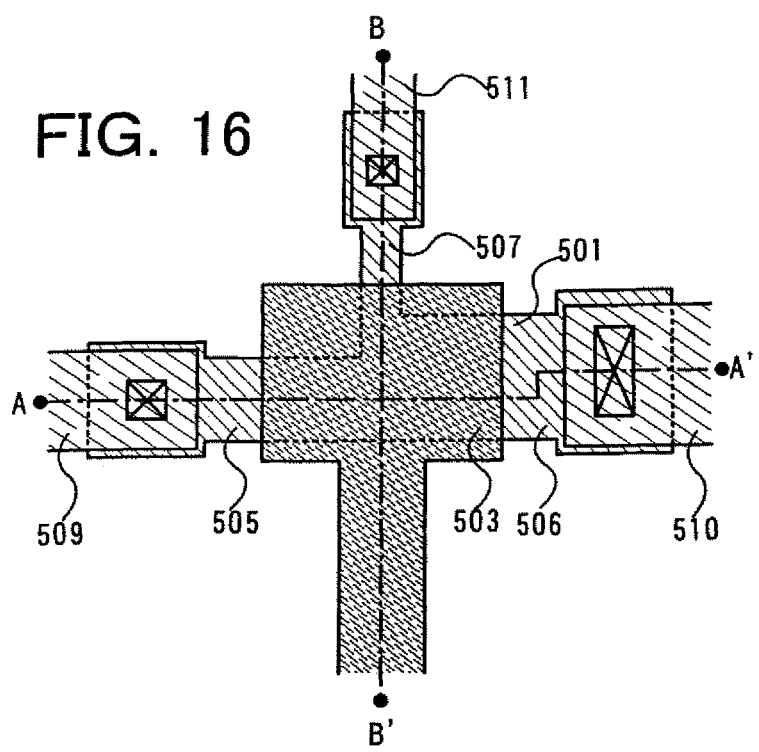
FIG. 16 shows an example of structure of a semiconductor element according to the invention.

When the channel length and the channel width of the first drain channel and the second drain channel of the driving element are equal, the video signal current $I_{vd}$ read into during the writing period is equal to the driving current $I_{el}$ supplied to the luminous element during the displaying period. The ratio of the video signal current $I_{vd}$ read into during the writing period and the driving current $I_{el}$ supplied to the luminous element during the displaying period can be adjusted by setting the channel length and the channel width of the first drain and the second drain unequal on purpose (refer to FIG. 16).

Such adjustment of the ratio is significantly convenient in practical use. When display is carried out at the low intensity by means of a compact and highly sophisticated light-emitting displaying device, for example, the driving current $I_{el}$ supplied to the luminous element during the displaying period becomes extremely small. This is because, in view of a load of such as the parasitic capacity, writing into the pixels is impossible within the displaying period unless the video signal current $I_{vd}$ is made larger than $I_{el}$.

When the writing period Ta is completed for the first line of pixel, the writing gate signal line P2 is selected, so that the writing period Ta for the second line of pixel would start. The writing element 101 then turns on in the second line of pixel. The initializing element 103 is in the off state since an initializing gate signal line E2 is not selected. The video signal current flows between the signal lines S1 to Sx and the power supply lines V1 to Vx through the writing element 101 and the driving element 102 in the second line of pixel on the basis of the video signal inputted from the source signal line driving circuit 202 to the pixel 201.

After the above, the writing period Ta is completed for the second line of pixel so as to start the displaying period Td. In the displaying period Td, the video signal current $I_{vd}$ is also stored in the second line of pixel as well as the case of the first line of pixel, and the luminous element 105 emits a light at the predetermined intensity. When the writing period Ta is completed for the second line of pixel, starts the writing period Ta for the third line of pixel.

Then, the operation is repeated such that the displaying period Td for the third line of pixel starts at the same time as starting of the writing period Ta for the fourth line of pixel, the writing period Ta is completed for the fourth line of pixel, and then, the displaying period Td for the fourth line of pixel starts at the same time as starting of the writing period Ta for the fifth line of pixel, . . . . The whole writing period for a frame is completed when the writing period Ta is completed until the y-th line, that is the final line, of pixel in turn.

In sight, an image during the displaying period Td for a frame is overlapped in the time so as to be caught as unified one. Therefore, image display is possible for a frame during the whole displaying period Td for a frame. Typically, in dynamic image display, an image is displayed for 60 Hz driving, that is, for 60 frames per a second.

The above is a whole operation without any initializing element 103. In the case that there is any initializing element 103, it is possible to further add the following initializing operation. An image for each frame is displayed in series when the initializing operation does not exist, so that there would be a problem that the dynamic image display is somewhat deteriorated such that smooth movement of an image is not enough. Such deterioration of the dynamic image quality can be easily and effectively restrained by providing a non-display interval between respective frames in the initializing operation.

The initializing operation is controlled by a gate signal outputted from the initializing gate signal line driving circuit 204. First, the first line of the initializing gate signal line E1 is selected in accordance with the gate signal outputted from the initializing gate signal line driving circuit 204 so as to start the initializing period Te for the first line of pixel. The initializing element 103 turns on upon selection of the initial gate signal line E1. The voltage of the power supply line V1 to Vx is then applied to a gate electrode of the driving element 102 through the initializing element 103. The driving element 102 is thereby forced to turn off not to supply the luminous element 105 with the current, so that the luminous element 105 would stop emitting a light.

Then, the initializing gate signal to be selected moves from E1 in the first line to E2 in the second line. The initializing period Te is thereby completed for the first line and the non-displaying period Tu starts. At the same time, start the initializing period Te for the second line of pixel.

The initializing element 103 turns on in the second line of pixel upon selection of the initializing gate signal line E2. The writing element 101 is in the off state since the writing gate signal line P2 is not selected. The voltage of the constant power supply lines V1 to Vx is added at that time to a gate electrode of the driving element 102 through the initializing element 103. The driving element 102 then turns off not to supply the luminous element 105 with the current, so that the luminous element 105 would stop emitting a light.

The initializing gate signal line to be selected moves from E2 in the second line to E3 in the third line after the above. The operation is so repeated that the initializing period Te starts in turn until the y-th line of pixel and a non-displaying period Tu starts after the completion of the initializing period Te. The initializing operation is thus carried out in all of the pixels.

In the case that the initializing operation is carried out with the initializing element 103, a frame period comprises the writing period Ta, the displaying period Td, the initializing period Te and the non-displaying period Tu and an image for a frame is displayed. After completion of a frame period, next frame period starts to repeat the above-mentioned operation. The dynamic image quality can be easily and effectively improved by providing a non-display interval between respective frames in the initializing operation. The initializing period Te and the non-displaying period Tu are not necessarily provided within a frame period. For example, it is possible to omit the initializing period Te and the non-displaying period Tu for a static image and to set the initializing period Te and the non-displaying period Tu only for a dynamic image.

The gradation of each pixel is determined in accordance with the amount of the current flowing to the luminous element 105 during the writing period. Ta and the displaying period Td. The current value is controlled in accordance with the video signal current $I_{vd}$ inputted from the source signal line driving circuit 202 to the pixel 201. It means that the video signal current $I_{vd}$ for n gradations enables image display for n gradations. Generally, it is said that the luminous intensity L of an OLED device is proportional to the current amount I (V) flowing to the OLED device, as expressed by L=c (V) I (V). The video signal current $I_{vd}$ for n gradations has, therefore, n values proportionally apportioned in general.

As described hereinbefore, the pixel circuit structure shown in FIG. 2 can maintain the current flowing to a luminous element such as an OLED device in the light-emitting device well even in the following cases: the case that the electric resistance of the luminous element depends on ambient temperature; and the case that the voltage-driving of the luminous element lowers the luminous intensity as the time elapses. Maintaining the current flowing in the luminous element well enables the luminous intensity to be kept good. As a result, color shift can be also avoided in a color display device of the type that respective sub-pixels in RGB are separately formed.

The current-driving of the luminous element in the pixel circuit structure shown in FIG. 2 enables significant difference between pixels in the amount of the current flowing to the luminous element to be prevented from occurring even when a characteristic of the driving element 102 for controlling the current flowing to the luminous element is different between pixels, so that the uneven intensity of a display screen can be also restrained.

Furthermore, the current flowing to the luminous element can be kept at the desired value, so that change of gradation due to potential fall caused by wiring resistance can be prevented. This is also an advantage in comparison with the voltage-driving of the luminous element.

A multi-drain transistor is a new device capable of being used effectively for a circuit, the circuit which is difficult to only comprise a single drain transistor, or which is possible to only comprise a single drain transistor but may be complicated or require the large area. An example of the multi-drain transistor is a pixel circuit of a light-emitting device comprising a writing element and a driving element as shown in FIGS. 2 and 15, in which a multi-drain transistor is used for one or both of the two elements.

Figure 17:
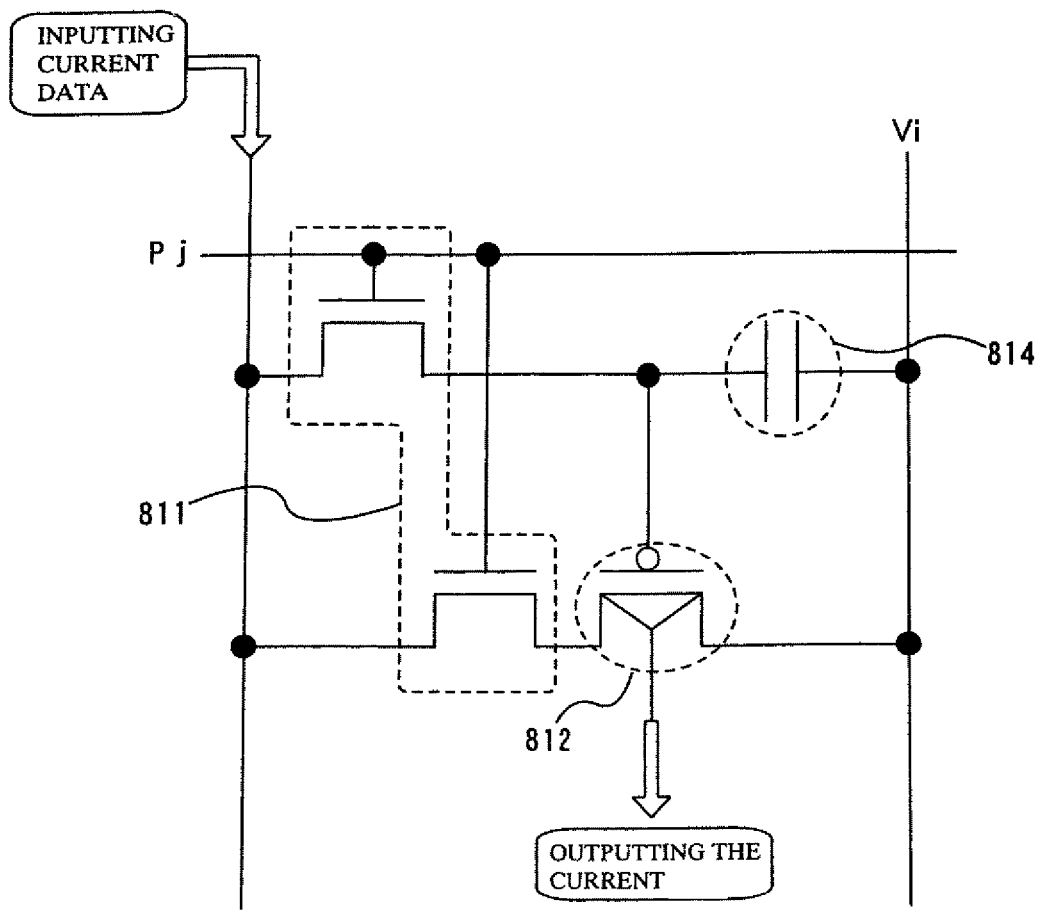
FIG. 17 shows an example of structure of an electric circuit according to the invention.

A current storing circuit comprising a writing element and a driving element in which a multi-drain transistor is used for one or both of the two elements (an example of which is shown in FIG. 17) can be widely used not only for a pixel circuit of a light-emitting device but also for a current signal buffer. For example, a current signal buffer using the current storing circuit with a multi-drain transistor can be provided in the source signal line driving circuit 202 (FIG. 1) of a light-emitting device.

In some cases, it is possible to apply the current storing circuit to a displaying device using a non-luminous element rather than a luminous element shown in FIG. 2.

Embodiment Mode 2

In Embodiment Mode 1, described an example of each of a semiconductor multi-drain transistor, a current storing circuit using the multi-drain transistor and a light-emitting device using the current storing circuit in a pixel according to the invention. In the light-emitting device described in Embodiment Mode 1, the video signal has an analog current value (referred to as analog driving, hereinafter), but it is possible to use the video signal digitally for driving (referred to as digital driving, hereinafter).

In the case of using a digital video signal, the gradation is coded in the binary number to be inputted. It is easy and effective as a method of displaying the gradation to write into a pixel the coded binary video signal as it is and to control the time or area for emitting a light in accordance with the binary code while the intensity of an emitted light is kept constant. In Embodiment Mode 2, an example of a method of controlling the time for emitting a light in accordance with a binary code (a digital time gradation method) is described briefly. It is possible to refer to Japanese Patent Application No. 359032/2000 for further detail.

In Embodiment Mode 2, used a pixel circuit shown in FIG. 2. In the digital time gradation method, it is possible to display an image by repeating the writing period Ta and the displaying period Td in a frame period.

In the case that an image is displayed by means of n bits of video signal, for example, at least n writing periods and n displaying periods are provided in a frame period. The n writing periods (Ta1 to Tan) and the n displaying periods (Td1 to Tdn) correspond to respective bits of the video signal.

Furthermore, it is possible, but not necessary, to provide the initializing periods not more than n and the non-displaying periods not more than n in a frame period. It is significantly difficult, in view of the current TFT manufacturing technology, to manufacture a practical display device and light-emitting device in which a signal line driving circuit is mounted on a glass substrate, without providing the initializing period and the non-displaying period for at least lower bits. For the further detail, refer to Japanese Patent Application No. 257163/2001.

After the writing period Tam (wherein m is any number from 1 to m), appears a displaying period Tdm corresponding to the above-mentioned bit. In the case that the initializing period Tem and the non-displaying period Tum are provided for the bit, appears a subsequent initializing period Tem and non-displaying period Tum. A series of periods comprising the writing period Ta, the displaying period Td, the initializing period Te and the non-displaying period Tu (as for the initializing period Te and the non-displaying period Tu, only the case of existence) is referred to as sub-frame period SF. A sub-frame period including the writing period Tam and the displaying period Tdm corresponding to the m-th bit is SFm.

The rate of the length of the sub-frame periods SF1 to SFn should satisfy SF1: SF2: . . . : SFn=2(0): 2(1): . . . : 2(n−1).

In each sub-frame period, whether the luminous element is made emit a light or not is selected by means of each bit of the digital video signal. The total of the length of the displaying periods for emitting a light in a frame period is controlled so as to control the number of gradations.

The sub-frame period in which the displaying period is long may be divided into some in order to improve the image quality in display.

An operation of the pixel circuit and the driving circuit are almost same as those of Embodiment Mode 1. The source signal line driving circuit is only required to accurately output a predetermined value of the current at the time the luminous element emits a light. As a result, it is an advantage that the structure can be greatly simplified in comparison with the case in Embodiment Mode 1 in which the analog current value corresponding to the number of gradations is necessary. When a signal for stopping the luminous element from emitting a light is outputted from the source signal line driving circuit, the data of the current values would be enough as well as when a signal with zero gradation is outputted in Embodiment Mode 1.

DESCRIPTION OF THE PREFERRED EMBODIMENTS

Embodiment 1

An Example of the Source Signal Line Driving Circuit 202 shown in FIG. 1 is described in this embodiment. The source signal line driving circuit 202 is capable of supplying respective source signal lines S1 to Sx with the current corresponding in size to the voltage of the video signal inputted to the pixel 201 (signal current $I_{vd}$). In this embodiment, an example of the source signal line driving circuit 302 in the case of digital-driving is first described with reference to FIG. 5. An example of the source signal line driving circuit 402 in the case of analog-driving is secondly described with reference to FIGS. 6A and 6B, and an example of the gate signal line driving circuit is thirdly described with reference to FIGS. 7A and 7B.

Figure 5:
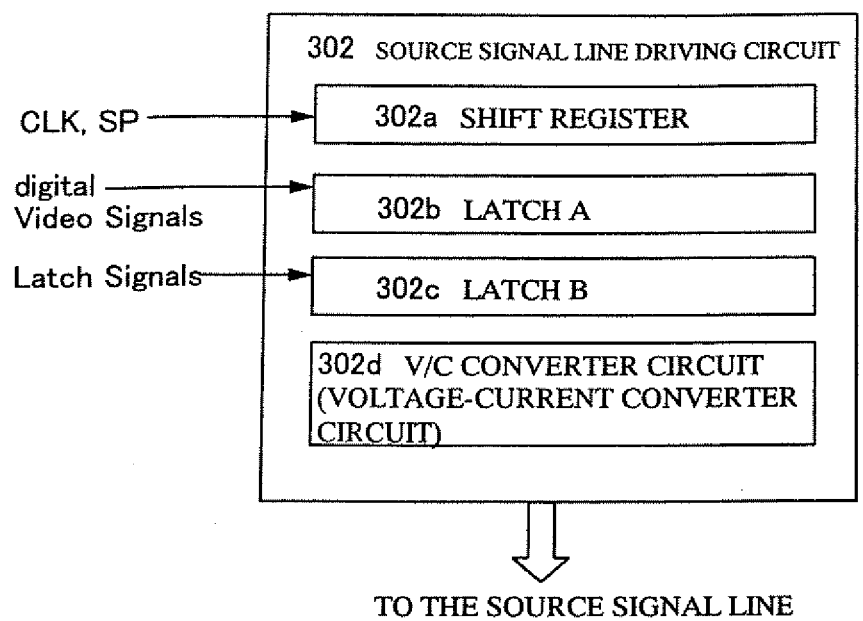
FIG. 5 is a block diagram showing an example of a source signal line driving circuit.

First, an example of the source signal line driving circuit 302 in the case of digital-driving is described with reference to FIG. 5. The source signal line driving circuit 302 has a shift register 302a, a latch (A) 302b capable of storing the digital video signal, a latch (B) 302c and a voltage-current converter circuit (a V/C converter circuit) 302d.

A clock signal (CLK) and a start pulse signal (SP) are inputted to the shift register 302a. The shift register 302a generates in turn timing signals for sampling the video signals on the basis of the clock signal (CLK) and the start pulse signal (SP). The latch (A) 302b reads from the video signal line and stores the video signals on the basis of the respective timing signals.

The video signal stored in the latch (A) 302b is read by the latch (B) 302c in accordance with the timing of a latch pulse so as to be stored. After the latch (B) 302c reads the data, the V/C converter circuit 302d outputs predetermined current data, when the read data indicates ON. When the read data indicates OFF, it is possible to output other predetermined current data, but is more efficiently and preferable to output the voltage data.

In the digital driving method, the driving operation is carried out under the following two states of the luminous element: the on state (in which the brightness is 100%); and the off state (in which the brightness is 0%). According to the above-mentioned structure of the source signal line driving circuit, the digital driving light-emitting device expresses gradation by switching the luminous element between the on and off states.

Figure 6A:
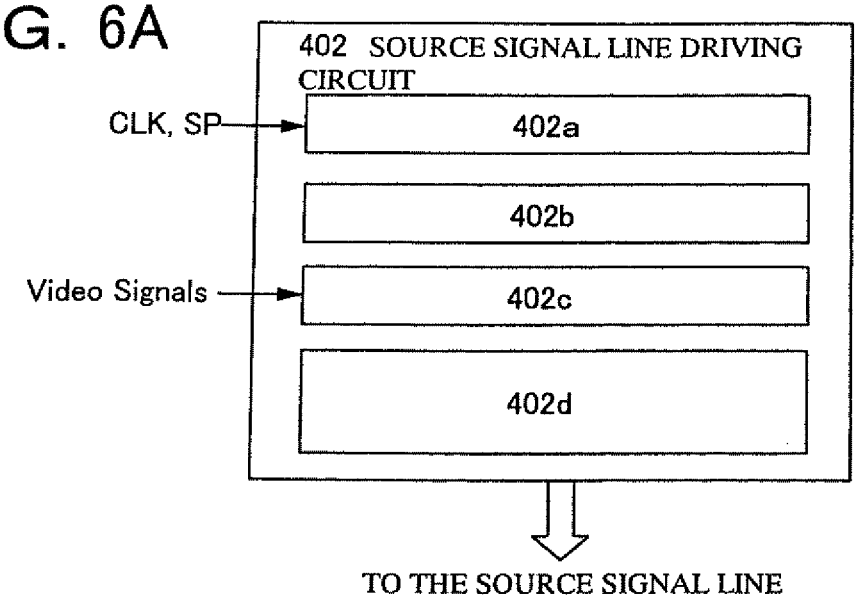
FIG. 6A is a block diagram showing an example of a source signal line driving circuit.

Next, an example of the source signal line driving circuit 402 in the case of analog-driving is described with reference to FIGS. 6A and 6B. The source signal line driving circuit 402 shown in FIG. 6A in this embodiment has a shift register 402a, a buffer 402b, a sampling circuit 402c and a current converter circuit 402d.

A clock signal (CLK) and a start pulse signal (SP) are inputted to the shift register 402a. The shift register 402a generates in turn timing signals for sampling the video signals on the basis of the clock signal (CLK) and the start pulse signal (SP).

The timing signal is buffered and amplified in the buffer 402b to be inputted to the sampling circuit 402c. It is possible to provide a level shifter instead of the buffer to amplify in voltage the timing signal, if necessary. Both of the buffer and the level shifter may be provided, and on the contrary, none of them may be provided so as not to especially amplify the timing signal.

The sampling circuit 402c reads in the video signal on the basis of the respective timing signals amplified in response to the necessity so as to transmit the video signal to the V/C converter circuit.

Figure 6B:
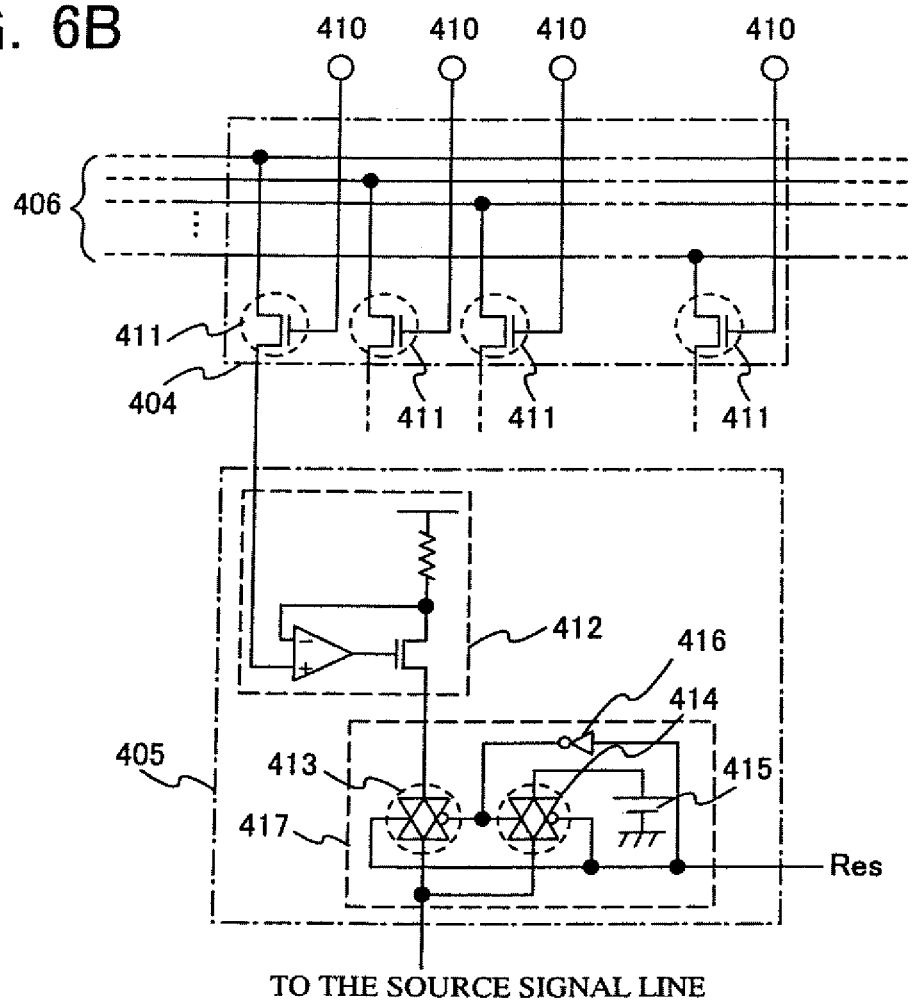
FIG. 6B is an example of a source signal line driving circuit.

FIG. 6B shows a concrete structure of the sampling circuit 402c and the current converter circuit 402d. The sampling circuit 402c is connected at a terminal 410 to an outputting portion of the buffer 402b.

The sampling circuit 402c is provided with a plurality of switches 411. Each switch 411 samples analog video signals from the video signal line 406 synchronously with the timing signal so as to transmit the sampled signals to the subsequent current converter circuit 402d. In FIG. 6B, only a current converter circuit connected to one of the switch 411 included in the sampling circuit 402c is shown as the current converter circuit 402d. There are other current converter circuits 402d as shown in FIG. 6B, however, connected behind the respective switches 411.

Only one transistor is used as the switch 411 in this embodiment, but the structure is not limited to this embodiment as long as the switch 411 is just a switch capable of sampling analog video signals synchronously with the timing signal.

The sampled analog video signal is inputted to a current outputting circuit 412 included in the current converter circuit 402d. The current outputting circuit 412 outputs the current corresponding to the inputted video signal voltage (signal current $I_{vd}$). The current outputting circuit comprises an amplifier and a transistor in FIGS. 6A and 6B. The invention is, however, not limited to the above structure and it is only required that the circuit is able to output the current having a value corresponding to the inputted video signal.

The signal current $I_{vd}$ is inputted to a reset circuit 417 also included in the current converter circuit 402d. The reset circuit 417 has two analog switches 413 and 414, an inverter 416 and a power supply 415.

The analog switch 414 is controlled by a reset signal (Res) while the analog switch 413 is controlled by a reset signal (Res) inverted by the inverter 416. Therefore, the analog switch 413 and the analog switch 414 operate synchronously with the inverted reset signal and the former reset signal, respectively, so that one would turn off when the other turns on.

When the analog switch 413 is in the on state, the signal current is inputted to the source signal line. On the other hand, the voltage of the power supply 415 is added to the source signal line so as to reset the source signal line when the analog switch 414 is in the on state. The voltage of the power supply 415 is preferably almost same as that of the power supply line provided in the pixel. The closer to zero the current flowing to the source signal line is in a reset state of the source signal line, the better.

The source signal line is preferably reset during a flyback period. It is possible, however, to reset the source signal line during a period other than the flyback period, if necessary, so long as an image is not displayed during the period.

Further, it is possible to use another circuit such as a decoder circuit, for example, instead of the shift register so as to be able to select the source signal line.

Now, the structure of the writing gate signal line driving circuit 203 and the initializing gate signal line driving circuit 204 will be described with reference to FIGS. 7A and 7B.

Figure 7A:
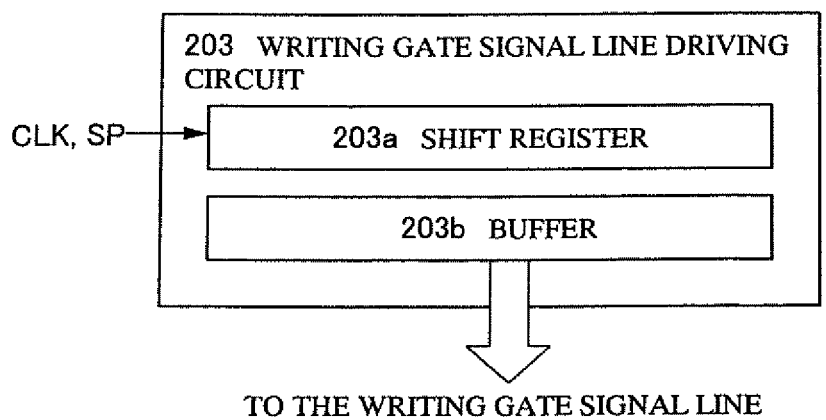
FIG. 7 A is a block diagram showing an example of a writing gate signal line driving circuit and FIG. 7 B is a block diagram showing an example of an initializing gate signal line driving circuit.

FIG. 7A is a block diagram showing the structure of the writing gate signal line driving circuit 203. The writing gate signal line driving circuit 203 has a shift register 203a and a buffer 203b. In some cases, the writing gate signal line driving circuit 203 may further have a level shifter and may have no buffer 203b.

In the writing gate signal line driving circuit 203, the timing signals are generated in turn by inputting the clock signal CLK and the start pulse signal SP to the shift register 203a. The respective generated timing signals are buffered and amplified by the buffer 203b so as to be supplied to the corresponding writing gate signal line.

The writing gate signal line is connected to a gate electrode of the writing element 101 in the pixels for a line. The buffer 203b is used for flowing a large amount of current since the writing element 101 in the pixels for a line should be simultaneously turned on.

Figure 7B:
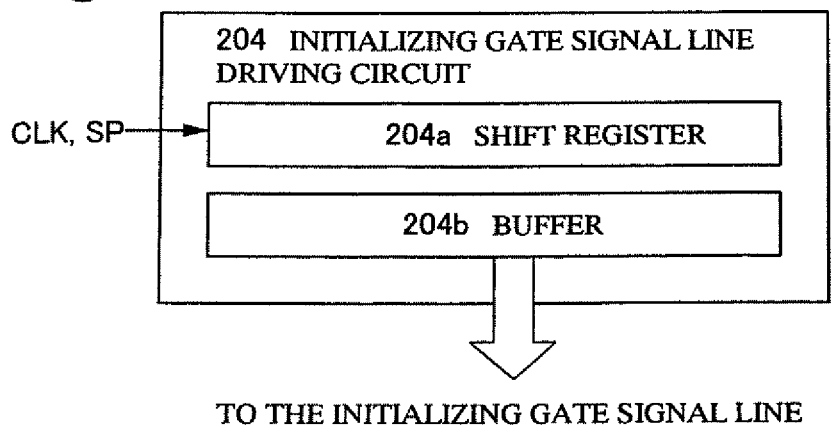

FIG. 7B is a block diagram showing the structure of the initializing gate signal line driving circuit 204. The initializing gate signal line driving circuit 204 has a shift register 204a and a buffer 204b. In some cases, the initializing gate signal line driving circuit 204 may further have a level shifter and may have no buffer 204b.

In the initializing gate signal line driving circuit 204, the timing signals are generated in turn by inputting the clock signal CLK and the start pulse signal SP to the shift register 204a. The respective generated timing signals are buffered and amplified by the buffer 204b so as to be supplied to the corresponding initializing gate signal line.

The initializing gate signal line is connected to a gate electrode of the initializing element 103 in the pixels for a line. The buffer 204b to be used is capable of flowing a large amount of current since the initializing element 103 in the pixels for a line should be simultaneously turned on.

Further, it is possible to use another circuit such as a decoder circuit, for example, instead of the shift register so as to be able to select the gate signal line (a scanning line).

The structure of the writing gate signal line driving circuit 203 and the initializing gate signal line driving circuit 204 may be different although it is same in this embodiment. The source signal line driving circuit, the writing gate signal line driving circuit and the initializing gate signal line driving circuit for driving the light-emitting device in accordance with the invention are not limited to the structure described in this embodiment.

The structure in this embodiment can be practically carried out in optional combination with either or both of Embodiment Modes 1 and 2.

Embodiment 2

Figure 8A:
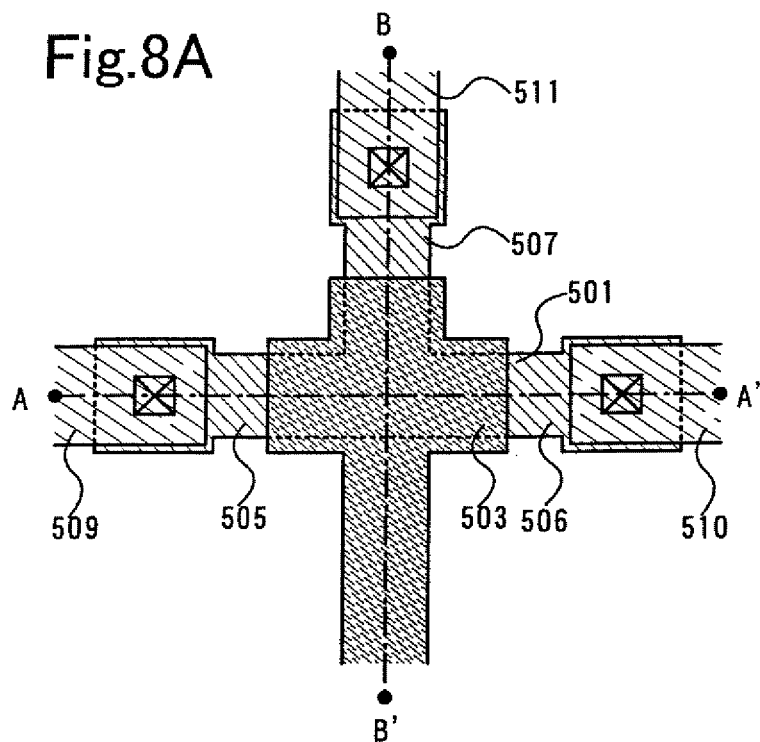
FIGS. 8 A-C show an example of structure of a semiconductor element according to the invention.
Figure 8B:
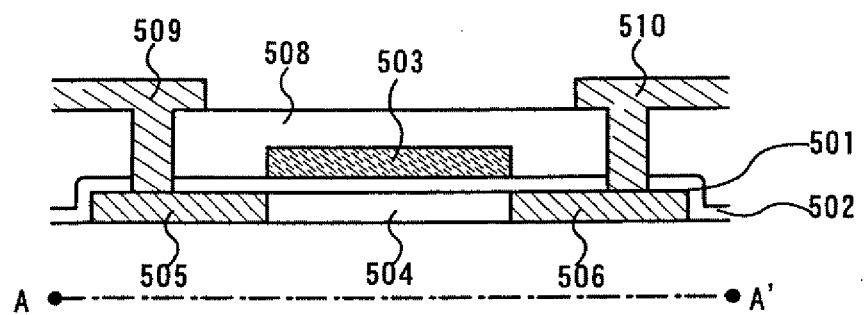
Figure 8C:
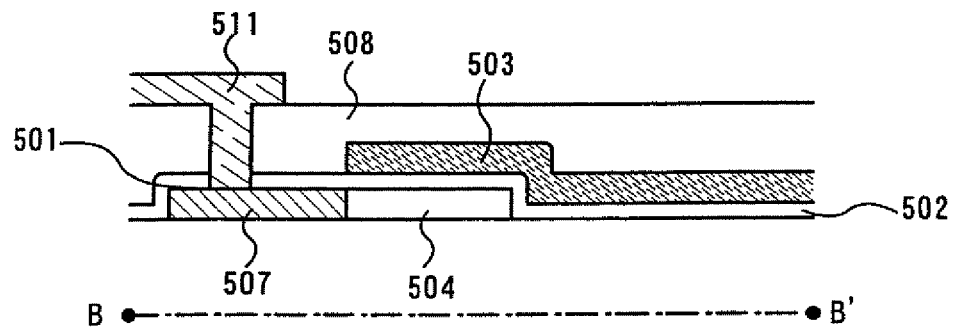

An example of a semiconductor element to be used for a light-emitting device in accordance with the invention is described in this embodiment with reference to FIGS. 8A-C.

FIG. 8A is a top view of a semiconductor element according to the invention. FIG. 8B is a sectional view taken by a broken line A-A' shown in FIG. 8A. FIG. 8C is a sectional view taken by a broken line B-B' shown in FIG. 8A.

The semiconductor element according to the invention has a semiconductor layer 501, a gate insulating film 502 contacting with the semiconductor layer 501 and a gate electrode 503 contacting with the gate insulating film 502. The semiconductor layer 501 has a channel forming region 504 and impurity regions 505, 506 and 507 to which impurity for giving conductivity is added. A typical example of the impurity is boron for the p-channel type and phosphorous for the n-channel type. The gate electrode 503 and the channel forming region 504 sandwich the gate insulating film therebetween and overlap each other.

The impurity regions 505, 506 and 507 contact with the channel forming region 504, respectively. In this embodiment, all of the impurity regions contact with the channel forming region 504, respectively, but the invention is not limited to this structure. It is possible to provide between the impurity region and the channel forming region a low concentration impurity region (an LDD region) in which the concentration of the impurity is lower than that of the impurity regions and to provide a region, which does not overlap with the gate electrode and in which no impurity is added (an offset region).

An insulating film 508 is formed on the gate insulating film 502 so as to cover the impurity regions 505, 506 and 507 of the semiconductor layer 501. Connecting wirings 509, 510 and 511 are formed so as to be connected respectively to the impurity regions 505, 506 and 507 through contact holes formed in the insulating film 508 and the gate insulating film 502. In FIGS. 8 A-C, the gate insulating film 502 covers the impurity regions 505, 506 and 507, but the invention is not limited to this structure. The impurity regions 505, 506 and 507 are not necessarily covered by the gate insulating film 502 and may be exposed.

In the semiconductor element shown in FIGS. 8A-C, the voltage applied to the gate electrode 503 simultaneously controls the resistance between the respective connecting wirings 509, 510 and 511.

The simplest way of using the semiconductor element shown in FIGS. 8 A-C is to connect or open three nodes, that is, nodes 509, 510 and 511, concretely, at the same time. The connection in this specification means electric connection so long as there is any description separately.

The way of utilizing a multi-drain transistor, however, is not limited to the above. For example, it is also possible to set the node 509 at high potential, the node 510 at low potential and the node 511 at middle potential to connect the gate electrode 503 with the node 511, and thereby, to flow the current between either one of the nodes 509 and 510 and the node 511 selectively.

Figure 18A:
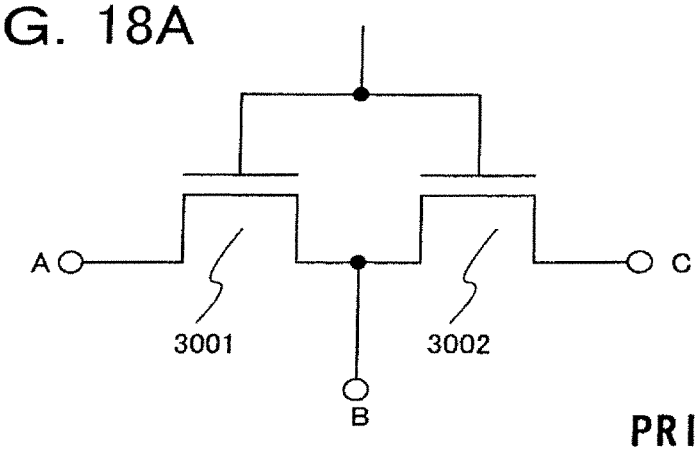
FIGS. 18A and 18B show examples of connecting three nodes by means of a conventional TFT.

Generally, more than two transistors are required in order to control connection of three nodes by means of a single drain transistor. An example of the above is described in FIGS. 18A and 18B. According to the invention, however, using a multi-drain transistor enables the total area, which is occupied by semiconductor elements such as a transistor, to be kept small. As a result, applying the semiconductor element according to the invention to a pixel circuit of a display device can be made highly fine or highly functionalize the display device without lowering the aperture rate of pixels.

The structure in this embodiment can be practically carried out in optional combination with either or all of Embodiment Modes 1 and 2 and Embodiment 1.

Embodiment 3

In this embodiment, a semiconductor element according to the invention, which is provided with two or more channel forming regions between respective impurity regions connected to the connecting wirings and which has a so-called multi gate structure, is described. The semiconductor element to be described in this embodiment has a double gate structure in which two channel forming regions are provided between the respective connecting wirings, but the invention is not limited to the double gate structure and may have a multi-gate structure in which three or more channel forming regions are provided between the respective wirings.

Figure 9A:
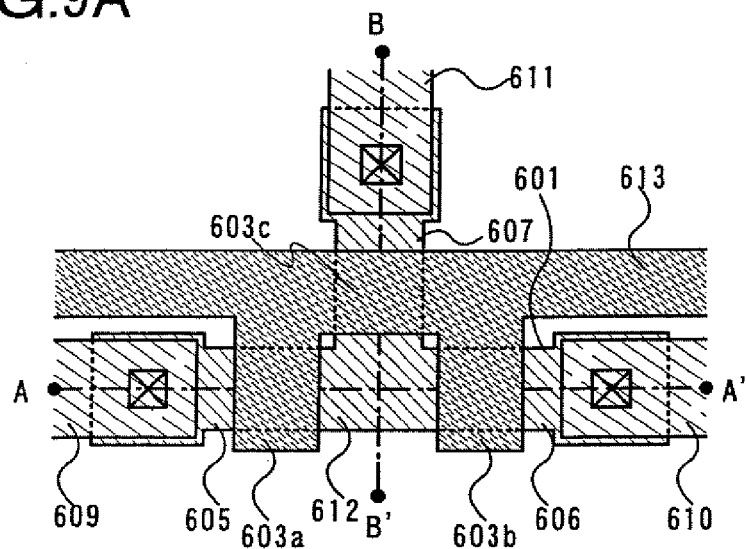
FIGS. 9A-C show examples of structure of a semiconductor element according to the invention.
Figure 9B:
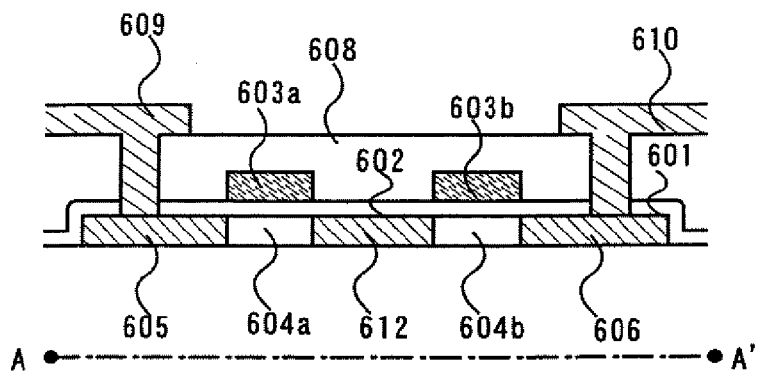
Figure 9C:
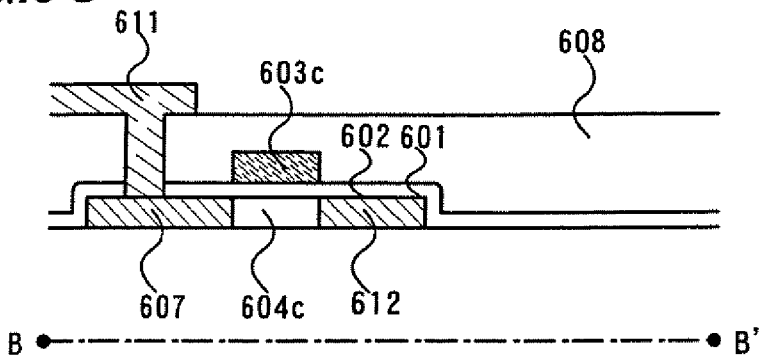

Now, the structure of the semiconductor element in this embodiment will be described with reference to FIGS. 9A-C. FIG. 9A is a top view of a semiconductor element to be used for the light-emitting device according to the invention. FIG. 9B is a sectional view taken by a broken line A-A' shown in FIG. 9A. FIG. 9C is a sectional view taken by a broken line B-B' shown in FIG. 9A.

The semiconductor element according to the invention has a semiconductor layer 601, a gate insulating film 602 contacting with the semiconductor layer 601 and a gate electrodes 603*a*, 603*b* and 603*c* contacting with the gate insulating film 602. The gate electrodes 603*a*, 603*b* and 603*c* are electrically connected each other and all of the gate electrodes form a part of a gate wiring 613 in this embodiment. The semiconductor layer 601 has a channel forming regions 604*a*, 604*b* and 604*c* and impurity regions 605, 606, 607 and 612 to which impurity for giving conductivity is added. A typical example of the impurity is boron for the p-channel type and phosphorous for the n-channel type.

The gate electrode 603*a* and the channel forming region 604*a* sandwich the gate insulating film 602 therebetween and overlap each other. The gate electrode 603*b* and the channel forming region 604*b* sandwich the gate insulating film 602 therebetween and overlap each other. And the gate electrode 603*c* and the channel forming region 604*c* sandwich the gate insulating film 602 therebetween and overlap each other.

The impurity regions 605, 606 and 607 contact with the channel forming region 604*a*, 604*b* and 604*c*, respectively. The impurity region 612 contacts with all of the channel forming regions 604*a*, 604*b* and 604*c*. Thus, the two channel forming regions 604*a* and 604*b* are provided between the impurity regions 605 and 606, the two channel forming regions 604*b* and 604*c* are provided between the impurity regions 606 and 607, and the two channel forming regions 604*c* and 604*a* are provided between the impurity regions 607 and 605.

In this embodiment, all of the impurity regions contact with the channel forming regions, respectively, but the invention is not limited to this structure. It is possible to provide between the impurity region and the channel forming region a low concentration impurity region (an LDD region) in which the concentration of the impurity is lower than that of the impurity regions and to provide a region, which does not overlap with the gate electrode and in which no impurity is added (an offset region).

An insulating film 608 is formed on the gate insulating film 602 so as to cover the impurity regions 605, 606 and 607 of the semiconductor layer 601. Connecting wirings 609, 610 and 611 are formed so as to be connected respectively to the impurity regions 605, 606 and 607 through contact holes formed in the insulating film 608 and the gate insulating film 602. In FIGS. 9 A-C, the gate insulating film 602 covers the impurity regions 605, 606 and 607, but the invention is not limited to this structure. The impurity regions 605, 606 and 607 are not necessarily covered by the gate insulating film 602 and may be exposed.

In the semiconductor element shown in FIGS. 9A-C, the voltage applied to the gate electrodes 603a, 603b and 603c controls the resistance between the respective connecting wirings 609, 610 and 611.

In the semiconductor element shown in FIGS. 9A-C, three nodes, that is, connecting wirings 609, 610 and 611, concretely, can be connected at the same time.

Figure 18B:
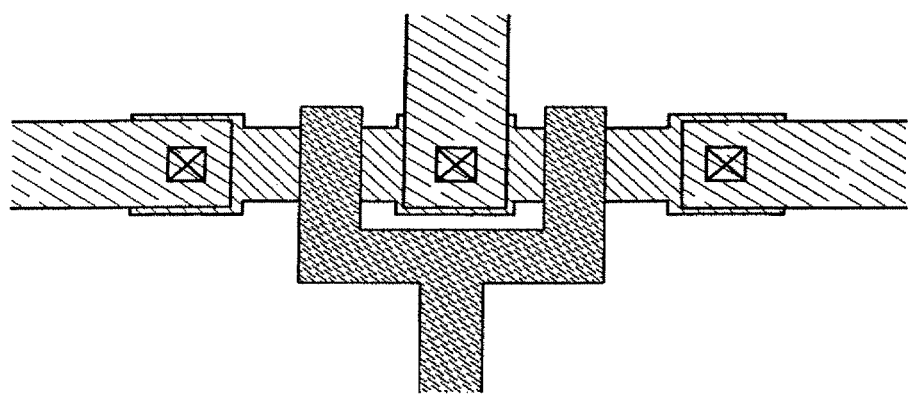

The above structure can keep the area of a semiconductor element small. As a result, applying the semiconductor element according to the invention to a pixel circuit of a display device enables the area occupied by semiconductor elements in a pixel to be kept small, and thereby, can be made highly fine or highly functionalize the display device without lowering the aperture rate of pixels. In the case of using a transistor with three terminals of a double gate, the connection of three nodes is controlled as shown in FIG. 18B, for example. In this case, however, the area to be occupied apparently becomes larger than that of a switching element shown in FIG. 9A.

Furthermore, in the multi-gate structure, the off-current can be made further microscopic in comparison with the single gate structure. Therefore, the multi-gate structure is more proper in the case of using a transistor as a switching element.

The structure in this embodiment can be practically carried out in optional combination with either or all of Embodiment Modes 1 and 2 and Embodiments 1 and 2.

Embodiment 4

In this embodiment, a bottom gate type of semiconductor element according to the invention, which is provided with a gate electrode between a substrate and a semiconductor layer thereof is described.

Figure 10A:
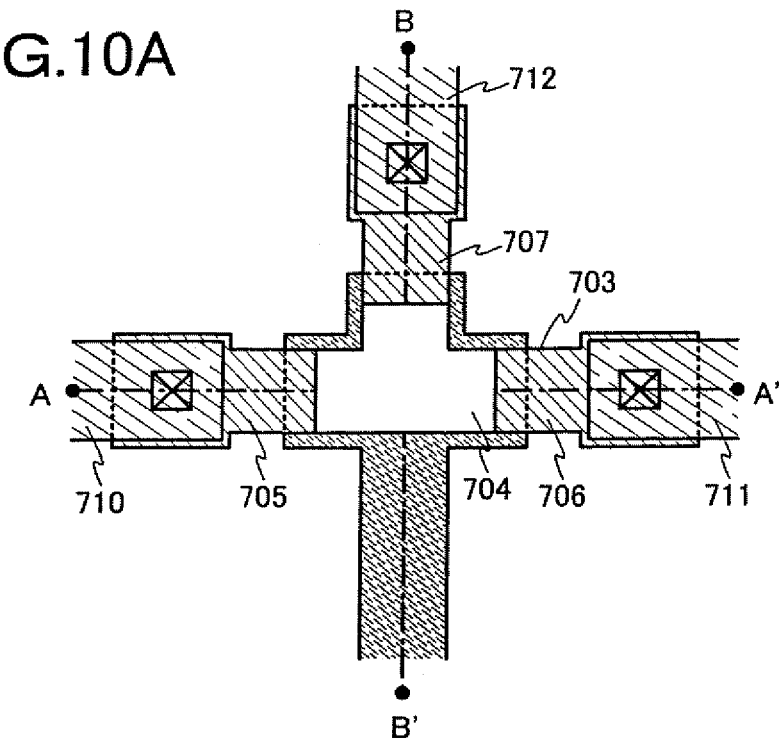
FIGS. 10A-C show examples of structure of a semiconductor element according to the invention.
Figure 10B:
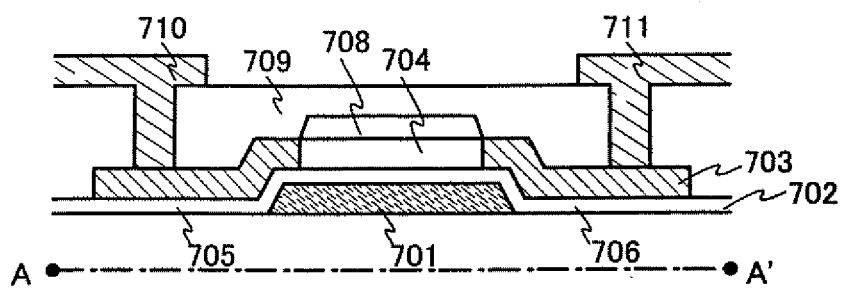
Figure 10C:
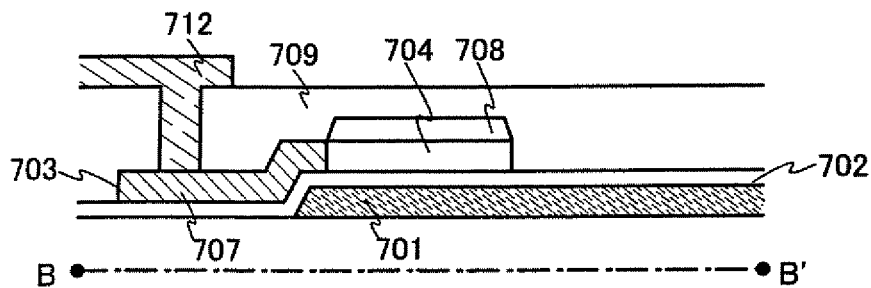

Now, the structure of the semiconductor element in this embodiment will be described with reference to FIG. 10. FIG. 10A is a top view of a semiconductor element according to the invention. FIG. 10B is a sectional view taken by a broken line A-A' shown in FIG. 10A. FIG. 10C is a sectional view taken by a broken line B-B' shown in FIG. 10A.

The semiconductor element according to the invention has a gate electrode 701, a gate insulating film 702 contacting with the gate electrode 701 and an active layer 703 contacting with the gate insulating film 702. The semiconductor layer 703 has a channel forming region 704 and impurity regions 705, 706 and 707 to which impurity for giving conductivity is added. The gate electrode 701 and the channel forming region 704 sandwich the gate insulating film 702 therebetween and overlap each other. 708 denotes a mask to be used in forming the channel forming regions, the mask which is made of an insulating film.

The impurity regions 705, 706 and 707 contact with the channel forming region 704, respectively. In this embodiment, all of the impurity regions contact with the channel forming region 704, respectively, but the invention is not limited to this structure. It is possible to provide between the impurity region and the channel forming region a low concentration impurity region (an LDD region) in which the concentration of the impurity is lower than that of the impurity regions and to provide a region, which does not overlap with the gate electrode and in which no impurity is added (an offset region).

An insulating film 708 is formed so as to cover the impurity regions 705, 706 and 707 of the semiconductor layer 703. Connecting wirings 709, 710 and 711 are formed so as to be connected respectively to the impurity regions 705, 706 and 707 through contact holes formed in the insulating film 708.

In the semiconductor element shown in FIG. 10, the voltage applied to the gate electrode 701 controls the resistance between the respective connecting wirings 709, 710 and 711.

In the semiconductor element shown in FIG. 10, three nodes, that is, connecting wirings 709, 710 and 711, concretely, can be connected at the same time.

The above structure can keep the area of a semiconductor element small. As a result, applying the semiconductor element according to the invention to a pixel circuit of a display device can be made highly fine or highly functionalize the display device without lowering the aperture rate of pixels.

It is also possible to provide two or more channel forming regions between the respective connecting wirings so as to form a multi-gate structure.

The structure in this embodiment can be practically carried out in optional combination with either or all of Embodiment Modes 1 and 2 and Embodiments 1 to 3.

Embodiment 5

An example of a method of manufacturing the light emitting device of the present invention will be described with a reference of FIGS. 11A to 11D and 12A to 12D. In this embodiment, a method of manufacturing the light emitting device having pixels as shown in FIG. 2. Note that, a driving element 102 and an initializing element 103 will be representatively explained here. Although writing element 101 is not illustrated particularly, it is possible that the writing element 101 is manufactured in accordance with the manufacturing method in this embodiment.

Although this embodiment shows an example of the light emitting device using an OLED element as a light emitting element, a light emitting device wherein only the light emitting element is substituted by other light emitting element can be manufactured.

Figure 11A:
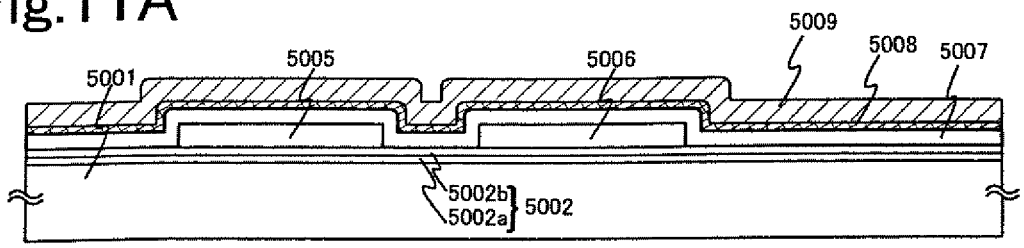
FIGS. 11A-D show processes of producing a light-emitting device according to the invention.

First, as shown in FIG. 11A, a base film 5002 formed of an insulating film such as a silicon oxide film, a silicon nitride film or a silicon oxynitride film is formed on a substrate 5001 formed of glass such as barium borosilicate glass or alumino borosilicate glass represented by #7059 glass and #1737 glass of Coning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenated silicon oxynitride film 5002b formed from $SiH_4$ and $N_2O$ and having a thickness of from 50 to 200 nm (preferably 100 to 150 nm) is layered thereon. In this embodiment, the base film 5002 has a two-layer structure, but may also be formed as a single layer film of one of the insulating films, or a laminate film having more than two layers of the insulating films.

Island-like semiconductor layers 5005 to 5006 are formed from a crystalline semiconductor film obtained by conducting laser crystallization method or a known thermal crystallization method on a semiconductor film having an amorphous structure. These island-like semiconductor layers 5005 to 5006 each has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 mJ/cm$^2$ (typically 200 to 300 mJ/cm$^2$). When the YAG laser is used, pulse oscillation frequency is preferably set to from 30 to 300 kHz by using its second harmonic, and laser energy density is preferably set to from 300 to 600 mJ/cm$^2$ (typically 350 to 500 mJ/cm$^2$). The laser beam converged into a linear shape and having a width of from 100 to 1000 μm, e.g. 400 μm, is irradiated to the entire substrate surface. At this time, overlapping ratio of the linear laser beam is set to from 50 to 90%.

Note that, a gas laser or solid state laser of continuous oscillation type or pulse oscillation type can be used. The gas laser such as an excimer laser, Ar laser, Kr laser and the solid state laser such as YAG laser, YVO$_4$ laser, YLF laser, YAlO$_3$ laser, glass laser, ruby laser, alexandrite laser, Ti: sapphire laser can be used as the laser beam. Also, crystals such as YAG laser, YVO$_4$ laser, YLF laser, YAlO$_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 01. to 10 MW/cm$^2$) is required. The semiconductor film is moved at approximately 10 to 2000 cm/s rate relatively corresponding to the laser beams so as to irradiate the semiconductor film.

Next, a gate insulating film 5007 covering the island-like semiconductor layers 5005 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon oxynitride film with a thickness of 120 nm. However, the gate insulating film is not limited to such a silicon oxynitride film, it may be an insulating film containing other silicon and having a single layer or a laminated layer structure. For example, when a silicon oxide film is used, TEOS (Tetraethyl Orthosilicate) and O$_2$ are mixed by the plasma CVD method, the reaction pressure is set to 40 Pa, the substrate temperature is set to from 300 to 400° C., and the high frequency (13.56 MHz) power density is set to from 0.5 to 0.8 W/cm$^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of α phase is about 20 μΩcm, and this Ta film can be used for the gate electrode. However, resistivity of the Ta film of β phase is about 180 μΩcm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride (WF$_6$). In any case, it is necessary to reduce resistance to use this film as the gate electrode. It is desirable to set resistivity of the W film to be equal to or smaller than 20 μΩcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film when the film is to be formed. Thus, a resistivity of from 9 to 20 μΩcm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and CF$_4$ and Cl$_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When CF$_4$ and Cl$_2$ are mixed, the W film and the Ta film are etched to the same extent.

Under the etching condition, end portions of a first conductive layer and a second conductive layer are formed into a tapered shape by effects of the bias voltage applied to the substrate side by making the shape of the mask made of resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5013 to 5014 of a first shape (first conductive layers 5013*a* to 5014*a* and second conductive layers 5013*b* to 5014*b*) formed of the first and second conductive layers are formed by the first etching processing. A region that is not covered with the conductive layers 5013 to 5014 of the first shape is etched by about 20 to 50 nm in the gate insulating film 5007, so that a thinned region is formed.

Figure 11B:
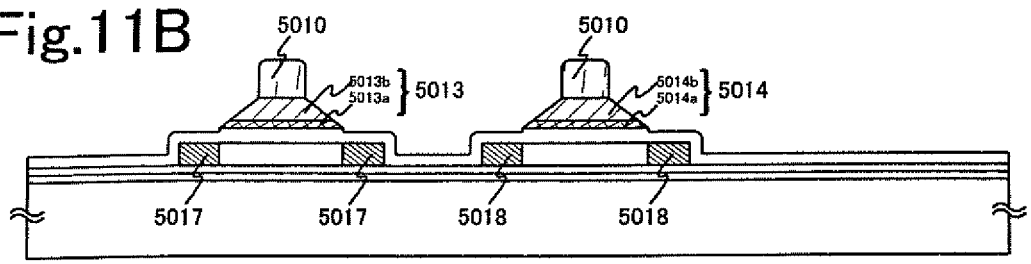

Then, an impurity element for giving an n-type conductivity is added by performing first doping processing. A doping method may be either an ion doping method or an ion implantation method. The ion doping method is carried out under the condition that a dose is set to from $1 \times 10^{13}$ to $5 \times 10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5013 to 5014 serve as masks with respect to the impurity element for giving the n-type conductivity, and first impurity regions 5017 to 5018 are formed in a self-aligning manner. The impurity element for giving the n-type conductivity is added to the first impurity regions 5017 to 5018 in a concentration range from $1 \times 10^{20}$ to $1 \times 10^{21}$ atoms/cm$^3$ (FIG. 11B).

Figure 11C:
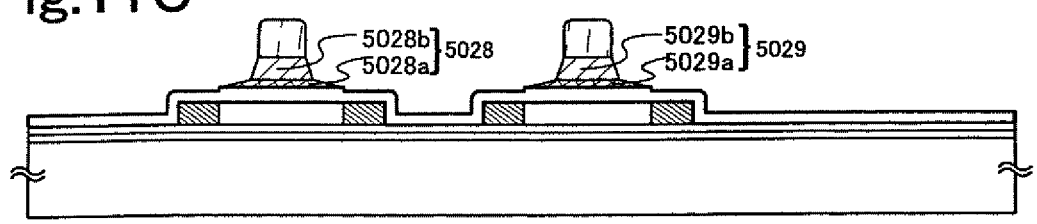

Second etching processing is next performed without removing the resist mask as shown in FIG. 11C. A W film is etched selectively by using CF$_4$, Cl$_2$ and O$_2$ as the etching gas. The conductive layers 5028 to 5029 of a second shape (first conductive layers 5028*a* to 5029*a* and second conductive layers 5028*b* to 5029*b*) are formed by the second etching processing. A region of the gate insulating film 5007, which is not covered with the conductive layers 5028 to 5029 of the second shape, is further etched by about 20 to 50 nm so that a thinned region is formed.

An etching reaction in the etching of the W film or the Ta film using the mixed gas of CF$_4$ and Cl$_2$ can be assumed from the vapor pressure of a radical or ion species generated and a reaction product. When the vapor pressures of a fluoride and a chloride of W and Ta are compared, the vapor pressure of WF$_6$ as a fluoride of W is extremely high, and vapor pressures of other WCl$_5$, TaF$_5$ and TaCl$_5$ are approximately equal to each other. Accordingly, both the W film and the Ta film are etched using the mixed gas of CF$_4$ and Cl$_2$. However, when a suitable amount of O$_2$ is added to this mixed gas, CF$_4$ and O$_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding O$_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

Figure 11D:
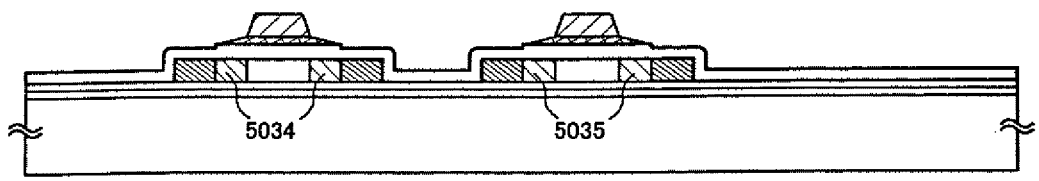

As shown in FIG. 11D, a second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, a new impurity region is formed inside the first impurity region formed in the island-like semiconductor layer in FIG. 11B. In the doping, the conductive layers 5028 to 5029 of the second shape are used as masks with respect to the impurity element, and the doping is performed such that the impurity element is also added to regions underside the first conductive layers 5028*a* to 5029*a*. Thus, third impurity regions 5034 to 5035 are formed. The third impurity regions 5034 to 5035 contain phosphorus (P) with a gentle concentration gradient that conforms with the thickness gradient in the tapered portions of the first conductive layers 5028*a* to 5029*a*. In the semiconductor layers that overlap the tapered portions of the first conductive layers 5028*a* to 5029*a*, the impurity concentration is slightly lower around the center than at the edges of the tapered portions of the first conductive layers 5028*a* to 5029*a*. However, the difference is very slight and almost the same impurity concentration is kept throughout the semiconductor layers.

Figure 12A:
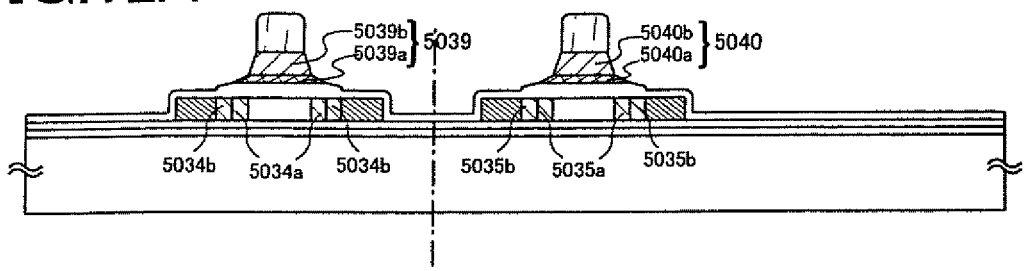
FIGS. 12A-D show processes of producing a light-emitting device according to the invention.

A third etching treatment is then carried out as shown in FIG. 12A. CHF$_6$ is used as etching gas, and reactive ion etching (RIE) is employed. Through the third etching treatment, the tapered portions of the first conductive layers 5028*a* to 5029*a* are partially etched to reduce the regions where the first conductive layers overlap the semiconductor layers. Thus formed are third shape conductive layers 5039 to 5040 (first conductive layers 5039*a* to 5040*a* and second conductive layers 5039*b* to 5040*b*). At this point, regions of the gate insulating film 5007 that are not covered with the third shape conductive layers 5039 to 5040 are further etched and thinned by about 20 to 50 nm.

Third impurity regions 5034 to 5035 are formed through the third etching treatment. The third impurity regions 5034*a* to 5035*a* that overlap the first conductive layers 5039*a* to 5040*a*, respectively, and second impurity regions 5034*b* to 5035*b* each formed between a first impurity region and a third impurity region.

Figure 12B:
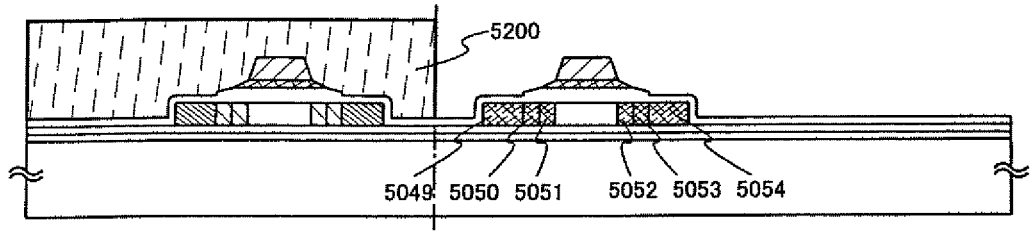

As shown in FIG. 12B, fourth impurity regions 5049 to 5054 having the opposite conductivity type to the first conductivity type are formed in the island-like semiconductor layer 5005 for forming p-channel type TFTs. The third shape conductive layer 5040*b* is used as a mask against the impurity element and impurity regions are formed in a self-aligning manner. At this point, the island-like semiconductor layer 5006 for forming n-channel type TFTs is entirely covered with a resist mask 5200. The impurity regions 5049 to 5054 have already been doped with phosphorus in different concentrations. The impurity regions 5049 to 5054 are doped with diborane (B$_2$H$_6$) through ion doping and its impurity concentrations are set to form $2 \times 10^{20}$ to $2 \times 10^{21}$ atoms/cm$^3$ in the respective impurity regions.

Through the steps above, the impurity regions are formed in the respective island-like, semiconductor layers. The third shape conductive layers 5039 to 5040 overlapping the island-like semiconductor layers function as gate electrodes.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5039 to 5040 is weak against heat, it is preferable to perform activation after an interlayer insulating film (having silicon as a principal component) is formed in order to protect wiring, etc.

When the activation is preformed by using the laser annealing method, the laser used in the crystallization can be used. When activation is performed, the moving speed is set as well as the crystallization processing, and the energy density of about 0.01 to 100 MW/cm$^2$ (preferably 0.01 to 10 MW/cm$^2$) is required.

Further, the heat treatment is performed for 1 to 12 hours at a temperature of from 300 to 450° C. within an atmosphere including 3 to 100% of hydrogen so that the island-like semiconductor layer is hydrogenated. This step is to terminate a dangling bond of the semiconductor layer by hydrogen thermally excited. Plasma hydrogenation (using hydrogen excited by plasma) may also be performed as another measure for hydrogenation.

Figure 12C:
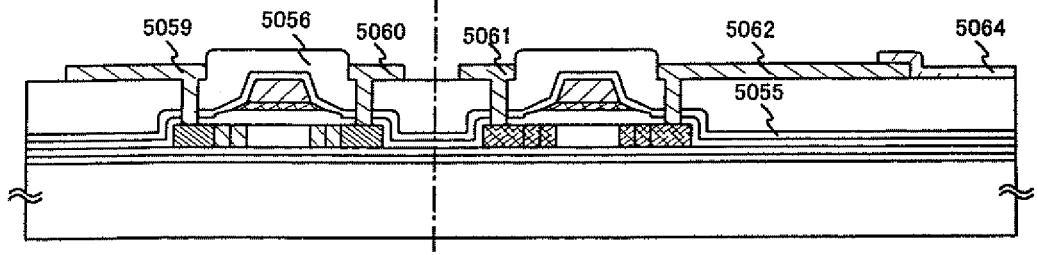

Next, as shown in FIG. 12C, a first interlayer insulating film 5055 is formed from a silicon oxynitride film with a thickness of 100 to 200 nm. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. Each wirings 5059 to 5062 are patterned and formed. Thereafter, a pixel electrode 5064 coming in contact with the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 (is further preferably set to from 2 to 4 µm).

In the formation of the contact holes, contact holes reaching n-type impurity region 5017 or p-type impurity regions 5049 and 5054 are formed respectively by using dry etching or wet etching.

Further, a laminate film of a three-layer structure is patterned in a desired shape and is used as wirings (including a connecting wiring and signal line) 5059 to 5062. In this three-layer structure, a Ti film with a thickness of 100 nm, an aluminum film containing Ti with a thickness of 300 nm, and a Ti film with a thickness of 150 mm are continuously formed by the sputtering method. Of course, another conductive film may also be used.

In this embodiment, an ITO film of 110 nm in thickness is formed as a pixel electrode 5064, and is patterned. Contact is made by arranging the pixel electrode 5064 such that this pixel electrode 5064 comes in contact with the connecting electrode 5062 and is overlapped with this connecting wiring 5062. Further, a transparent conductive film provided by mixing 2 to 20% of zinc oxide (ZnO) with indium oxide may also be used. This pixel electrode 5064 becomes an anode of the light emitting element (FIG. 12A).

As shown in FIG. 12I), an insulating film (a silicon oxide film in this embodiment) containing silicon with a thickness of 500 nm is next formed. A third interlayer insulating film 5065 functions as a bank is formed in which an opening is formed in a position corresponding to the pixel electrode 5064. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic Light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of light emitting elements corresponding to RGB is used. However, a system in which an light emitting element for emitting white light and a color filter are combined, a system in which the light emitting element for emitting blue or blue green light is combined with a fluorescent substance (a fluorescent color converting medium: CCM), a system for overlapping the light emitting elements respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

Next, the cathode 5067 is formed by using metal mask. This embodiment uses MgAg for, the cathode 5067 but it is not limited thereto. Other known materials may be used for the cathode 5067.

Finally, a passivation film 5068 formed of silicon nitride film and having a thickness of 300 nm is formed. By forming the passivation film 5068, the passivation film 5068 plays a role of protecting the organic light emitting layer 5066 from moisture or the like. Thus, reliability of the light emitting element can be further improved.

Figure 12D:
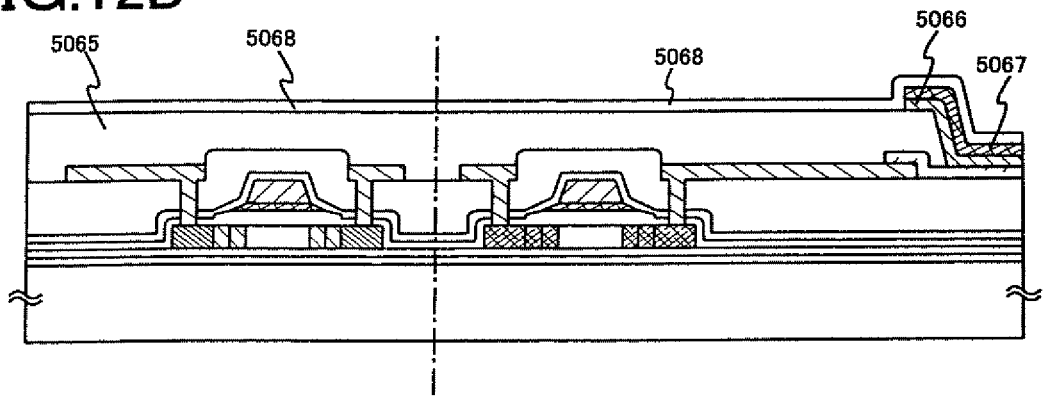

Accordingly, the light emitting device having a structure shown in FIG. 12D is completed.

The light emitting device in this embodiment has very high reliability and improved operation characteristics by arranging the TFTs of the optimal structure in a driving circuit portion in addition to the pixel portion. Further, in a crystallization process, crystallinity can be also improved by adding a metal catalyst such as Ni. Thus, a driving frequency of the signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, an overlapping LDD region ($L_{OV}$ region) that is overlapped with the gate electrode through the gate insulating film, an offset LDD region ($L_{OFF}$ region) that is not overlapped with the gate electrode through the gate insulating film, and channel forming region.

Deterioration by the hot carrier injection in the p-channel type TFT of the CMOS circuit is almost negligible. Therefore, it is not necessary to particularly form the LDD region in this p-channel type TFT. However, similar to the n-channel type TFT, the LDD region can be formed in the p-channel type TFT as a hot carrier countermeasure.

Further, when the CMOS circuit for bi-directionally flowing an electric current through channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a $L_{OV}$ region. The transmission gate used in the dot sequential driving can be given also as an example as such.

In practice, the device reaching the state of FIG. 12D is packaged (enclosed) using a protective film that is highly airtight and allows little gas to transmit (such as a laminate film and a UV-curable resin film) or a light-transmissive sealing material, so as to further avoid exposure to the outside air. A space inside the seal may be set to an inert atmosphere or a hygroscopic substance (barium oxide, for example) may be placed there to improve the reliability of the light emitting element.

After securing the airtightness through packaging or other processing, a connector (flexible printed circuit: FPC) is attached for connecting an external signal terminal with a terminal led out from the elements or circuits formed on the substrate. The device in a state that can be shipped is called display device in this specification.

Furthermore, in accordance with the processes shown in this embodiment, the number of photomasks can be reduced that is need for manufacturing the light emitting device. As a result, the processes can be reduced, and this contributes to a reduction in the manufacturing costs and an increase in throughput.

The method of manufacturing the light emitting device of the present invention is not limited to the method of manufacturing the light emitting device described in this embodiment. Therefore, the light emitting device of the present invention can be fabricated by known method.

This embodiment can be executed by freely combining with configurations shown in Embodiment Modes 1 to 2, and Embodiments 1 to 4.

Embodiment 6

In this embodiment, an external appearance of the light emitting device of the present invention is described with reference to FIGS. 13A to 13C. In this embodiment, a light emitting element is referred to as an OLED element. However, other light emitting element may be used in place of the OLED element.

Figure 13A:
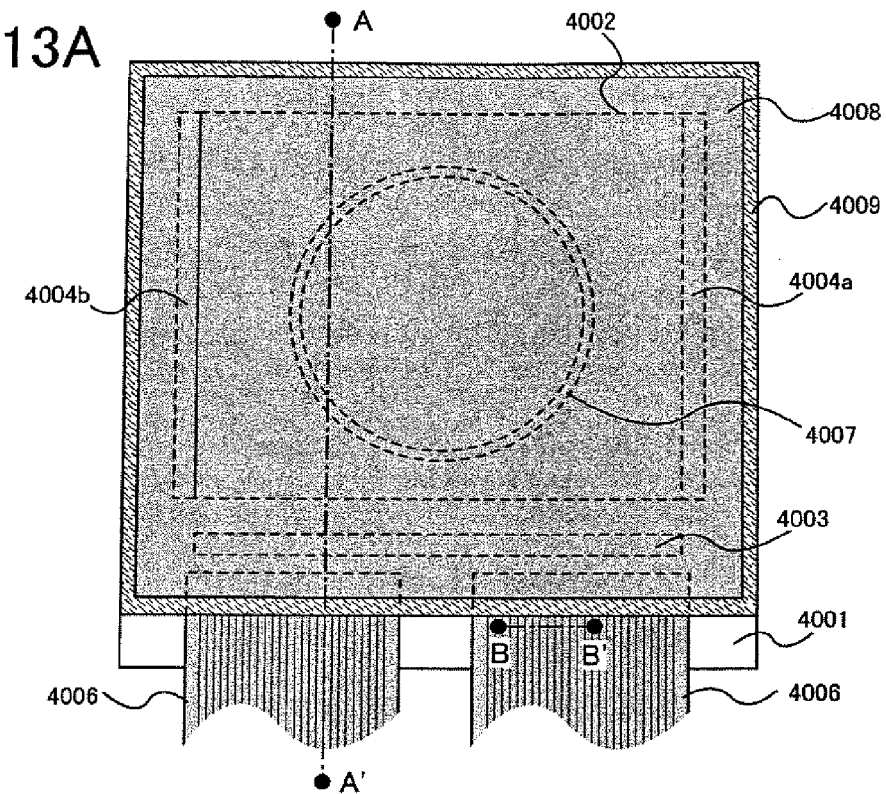
FIGS. 13A-C show appearances of a light-emitting device according to the invention.
Figure 13B:
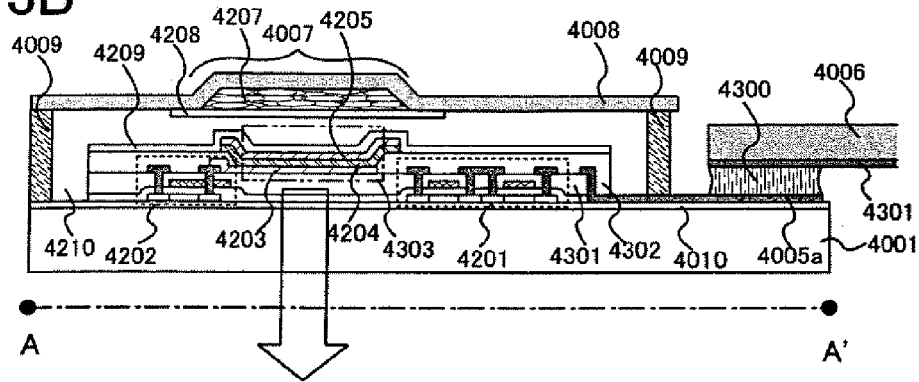
Figure 13C:
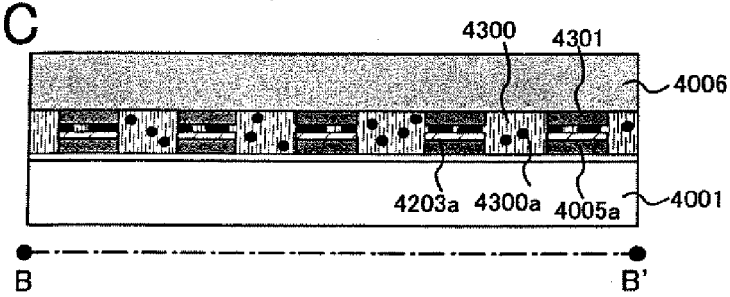

FIG. 13A is a top view of the light emitting device which is formed according as the element substrate with the transistor is sealed by sealing materials, FIG. 13 B is a cross sectional view taken along with a line A-A' of FIG. 13A, and FIG. 13C is a cross sectional view taken along with a line B-B' of FIG. 13A.

A seal member 4009 is provided so as to surround a pixel portion 4002, a source signal line driving circuit 4003, and writing and initializing gate signal line driving circuits 4000a, 4000b, which are provided on a substrate 4001. Further, a sealing material 4008 is provided on the pixel portion 4002, the signal line driving circuit 4003, and the writing and initializing gate signal line driving circuits 4004a, 4004b. Thus, the pixel portion 4002, the source signal line driving circuit 4003, and the writing and initializing gate signal line driving circuits 4004a, 4004b are sealed by the substrate 4001, the seal member 4009 and the sealing material 4008. Although reference numeral 4210 is a hollow portion, a filler can be implanted in the hollow portion.

Further, the pixel portion 4002, the source signal line driving circuit 4003, and the writing and initializing gate signal line driving circuits 4004a, 4004b, which are provided on the substrate 4001, have a plurality of TFTs. In FIG. 13B, a TFT, hereafter referred to as a driving TFT (hereafter, only an n-channel TFT and a p-channel TFT are shown in the FIG. 4201 included in the source signal line driving circuit 4003 and a driving element 4202 included in the pixel portion 4002, which are formed on a base film 4010, are typically shown.

In this embodiment, the p-channel TFT or the n-channel TFT manufactured by a known method is used as the driving TFT 4201, and the n-channel TFT manufactured by a known method is used as an initializing element 103 (not shown in FIG. 13).

An interlayer insulating film (leveling film) 4301 is formed on the driving TFT 4201 and the driving element 4202, and a pixel electrode (anode) 4203 electrically connected to a drain of the driving element 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The transparent conductive film added with gallium may also be used.

Then, an insulating film 4302 is formed on the pixel electrode 4203, and the insulating film 4302 is formed with an opening portion on the pixel electrode 4203. In this opening portion, an organic light emitting layer 4204 is formed on the pixel electrode. 4203. A known organic light emitting material or inorganic light emitting material may be used for the organic light emitting layer 4204. Further, there exist a low molecular weight material and a polymeric material as the organic light emitting materials, and both the materials may be used.

A known evaporation technique or application technique may be used as a method of forming the organic light emitting layer 4204. Further, the structure of the organic light emitting layer may take a lamination structure by freely combining a hole injection layer, a hole transporting layer, a light emitting layer, electron transporting layer, and electron injection layer. Also, the structure of the organic light emitting layer may take a single layer structure.

A cathode 4205 made of a conductive film having light-shielding property (typically, conductive film containing aluminum, copper or silver as its main constituent or lamination film of the conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the described film deposition is enabled by using a multi-chamber type (cluster tool type) film forming device.

As described above, a light emitting element 4303 constituted of the pixel electrode (anode) 4203, the organic light emitting layer 4204 and the cathode 4205 is formed. Further, a protective film 4209 is formed on the insulating film 4302 so as to cover the light emitting element 4303. The protective film 4209 is effective in preventing the intrusion of oxygen, moisture and the like from the light emitting element 4303.

Reference numeral 4005a denotes a wiring drawn to be connected to the power supply line, and the wiring 4005a is electrically connected to a source region of the driving element 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the light emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4103, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4103 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the light emitting element 4303 can be suppressed by providing the hygroscopic substance or the substance that can absorb oxygen 4207.

As shown in FIG. 13C, the pixel electrode 4203 is formed, and at the same time, a conductive film 4203a is formed so as to contact with the surface of the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that the structure of Embodiment 6 can be implemented by being freely combined with the structures shown in Embodiment Modes 1 to 2, and Embodiments 1 to 5.

Embodiment 7

Light emitting materials used in light emitting elements are classified roughly into a low molecular weight material and a polymeric material. The light emitting device of the present invention can employ a low molecular weight organic light emitting material and a polymeric organic light emitting material both. Further, materials which are difficult to be classified into a low molecular weight material and a polymeric material (such as a material disclosed in Japanese Patent Application No. 2001-167508) may be used according to circumstances.

A low molecular weight organic light emitting material is formed into a film by evaporation. This makes it easy to form a laminate structure, and the efficiency is increased by layering films of different functions such as a hole transporting layer and an electron transporting layer. Of course, a hole transporting layer, an electron transporting layer and the like do not always exist clearly, and a single layer or a plurality of layers of the hole transporting layer and the electron transporting layer in mixed state may be exist (for example, Japanese Patent Application No. 2001-020817, etc. are referred to), thereby elongation the lifetime of the element and improvement of the light emitting efficiency of the element may be achieved.

Examples of low molecular weight light emitting material include an aluminum complex having quinolinol as a ligand ($Alq_3$), a triphenylamine derivative (TPD) and the like.

On the other hand, a polymeric light emitting material is physically stronger than a low molecular weight light emitting material and enhances the durability of the element. Furthermore, a polymeric material can be formed into a film by application and therefore manufacture of the element is relatively easy.

The structure of a light emitting element using a polymeric light emitting material is basically the same as the structure of a light emitting element using a low molecular weight light emitting material, and has a cathode, an organic light emitting layer, and an anode. When an organic light emitting layer is formed from a polymeric organic light emitting material, a two-layer structure is popular among the known ones. This is because it is difficult to form a laminate structure using a polymeric material unlike the case of using a low molecular weight organic light emitting material. Specifically, an element using a polymeric organic light emitting material has a cathode, a light emitting layer, a hole transporting layer, and an anode. Note that, Ca may be employed as the cathode material in a light emitting element using a polymeric light emitting material.

The color of light emitted from an element is determined by the material of its light emitting layer. Therefore, a light emitting element that emits light of desired color can be formed by choosing an appropriate material. The polymeric organic light emitting material that can be used to form a light emitting layer is a polyparaphenylene vinylene-based material, a polyparaphenylene-based material, a polythiophen-based material, or a polyfluorene-based material.

The polyparaphenylene vinylene-based material is a derivative of poly(paraphenylene vinylene) (denoted by PPV), for example, poly(2,5-dialkoxy-1,4-phenylene vinylene) (denoted by RO-PPV), poly(2-(2'-ethyl-hexoxy)-5-metoxy-1,4-phenylene vinylene) (denoted by MEH-PPV), poly(2-(dialkoxyphenyl)-1,4-phenylene vinylene) (denoted by ROPh-PPV), etc.

The polyparaphenylene-based material is a derivative of polyparaphenylene (denoted by PPP), for example, poly(2,5-dialkoxy-1,4-phenylene) (denoted by RO-PPP), poly(2,5-di-hexoxy-1,4-phenylene), etc.

The polythiophene-based material is a derivative of polythiophene (denoted by PT), for example, poly(3-alkylthiophene) (denoted by PAT), poly(3-hexylthiophene) (denoted by PHT), poly(3-cyclohexylthiophene) (denoted by PCHT), poly(3-cyclohexyl-4-methylthiophene) (denoted by PCHMT), poly(3,4-dicyclohexylthiophene) (denoted by PDCHT), poly[3-(4-octylphenyl)-thiophene] (denoted by POPT), and poly[3-(4-octylphenyl)-2,2 bithiophene] (denoted by PTOPT), etc.

The polyfluorene-based material is a derivative of polyfluorene (denoted by PF), for example, poly(9,9-dialkylfluorene) (denoted by PDAF) and poly(9,9-dioctylfluorene) (denoted by PDOF), etc.

If a layer that is formed of a polymeric light emitting material capable of transporting holes is sandwiched between an anode and a polymeric light emitting material layer that emits light, injection of holes from the anode is improved. This hole transporting material is generally dissolved into water together with an acceptor material, and the solution is applied by spin coating or the like. Since the hole transporting material is insoluble in an organic solvent, the film thereof can form a laminate with the above-mentioned light emitting material layer that emits light.

A mixture of PEDOT and camphor sulfonic acid (denoted by CSA) that serves as the acceptor material, a mixture of polyaniline (denoted by PANI) and polystyrene sulfonic acid (denoted by PSS) that serves as the acceptor material and the like can be given as the polymeric light emitting material capable of transporting holes.

The structure of this embodiment may be freely combined with any of the structures of Embodiment Modes 1 to 2, and Embodiments 1 to 6.

Embodiment 8

The light emitting device can be used for a display device of various equipments by utilizing the characteristics of the light emitting element. For example, the light emitting device using an OLED as a light emitting element exhibits more excellent recognizability of the display image because of the high contrast of brightness and darkness and the light emitting device has a wider viewing angle as compared to a liquid crystal display device. Therefore, the light emitting device is advantageous for the monitoring usage. Furthermore, the light emitting device is highly advantageous to a display device for displaying animation since the light emitting device has a characteristic of high speed response. Also, the light emitting device is advantageous to a portable apparatus since the light emitting device is thin and light weight.

Such electronic devices using a light emitting device of the present invention include a video camera, a digital camera, a goggles-type display (head mount display), a navigation system, a sound reproduction device (such as a car audio equipment and an audio set), a lap-top computer, a game machine, a portable information terminal (such as a mobile computer, a mobile telephone, a portable game machine, and an electronic book), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIGS. 14A to 14H respectively shows various specific examples of such electronic devices.

Figure 14A:
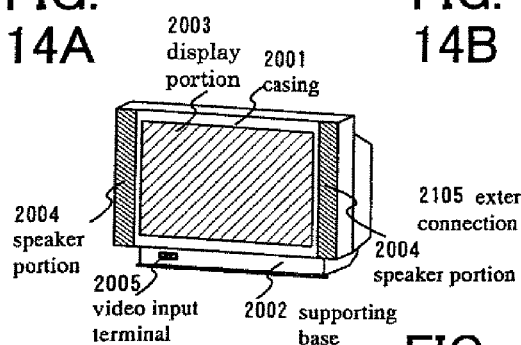
FIGS. 14A-H show electronic equipments according to the invention.

FIG. 14A illustrates a display device which includes a casing 2001, a support table 2002, a display portion 2003, a speaker portion 2004, a video input terminal 2005 and the like. The present invention is applicable to the display portion 2003. The light emitting device is of the self-emission-type and therefore requires no backlight. Thus, the display portion thereof can have a thickness thinner than that of the liquid crystal display device. The light emitting element display device is including the entire display device for displaying information, such as a personal computer, a receiver of TV broadcasting and an advertising display.

Figure 14B:
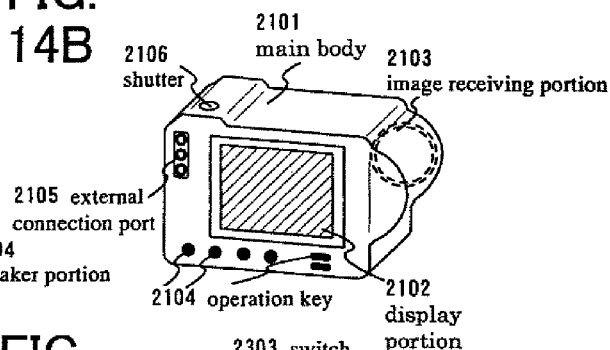

FIG. 14B illustrated a digital still camera which includes a main body 2101, a display portion 2102, an image receiving portion 2103, an operation key 2104, an external connection port 2105, a shutter 2106, and the like. The light emitting device of the present invention can be used as the display portion 2102.

Figure 14C:
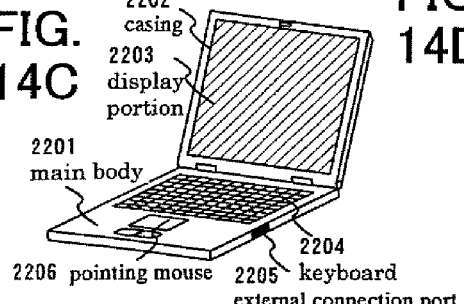

FIG. 14C illustrates a lap-top computer which includes a main body 2201, a casing 2202, a display portion 2203, a keyboard 2204, an external connection port 2205, a pointing mouse 2206, and the like. The light emitting device of the present invention can be used as the display portion 2203.

Figure 14D:
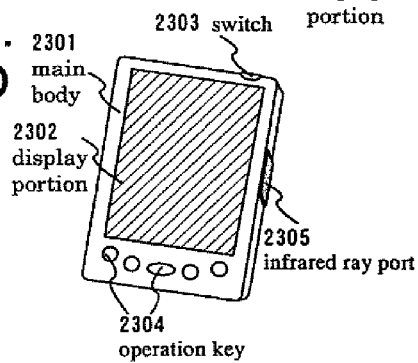

FIG. 14D illustrated a mobile computer which includes a main body 2301, a display portion 2302, a switch 2303, an operation key 2304, an infrared port 2305, and the like. The light emitting device of the present invention can be used as the display portion 2302.

Figure 14E:
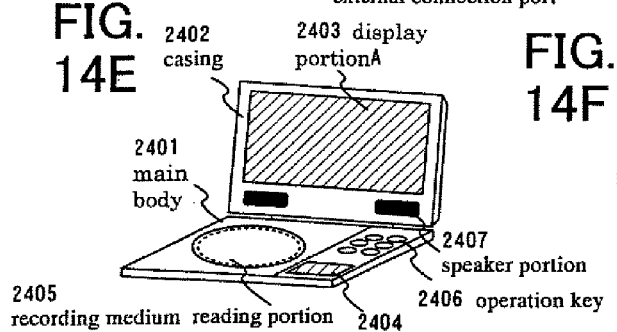

FIG. 14E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The light emitting device of the present invention can be used as these display portions A 2403 and B 2404. The image reproduction apparatus including a recording medium further includes a game machine or the like.

Figure 14F:
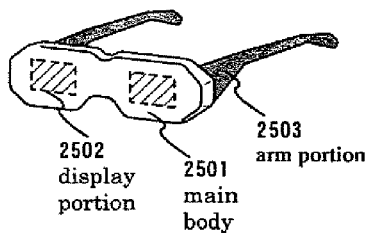

FIG. 14F illustrates a goggle type display (head mounted display) which includes a main body 2501, a display portion 2502, arm portion 2503, and the like. The light emitting device of the present invention can be used as the display portion 2502.

Figure 14G:
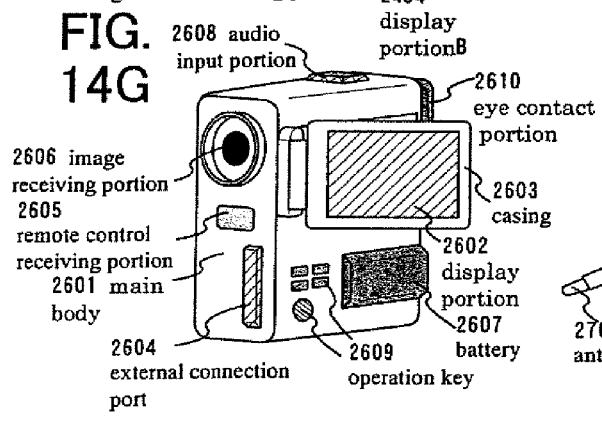

FIG. 14G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, and the like. The light emitting device of the present invention can be used as the display portion 2602.

Figure 14H:
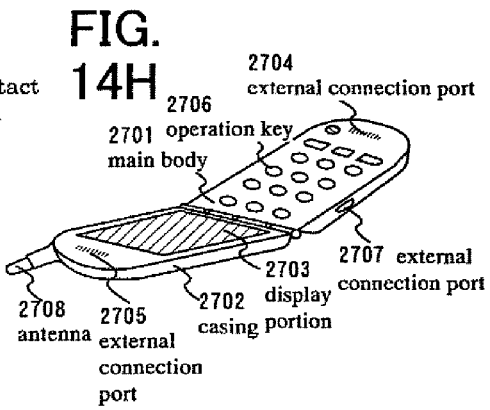

FIG. 14H illustrates a mobile telephone which includes a main body 2701, a casing 2702, a display portion 2703, a sound input portion 2704, a sound output portion 2705, an operation key 2706, an external connecting port 2707, an antenna 2708, and the like. The light emitting device of the present invention can be used as the display portion 2703. Note that the display portion 2703 can reduce power consumption of the mobile telephone by displaying white-colored characters on a black-colored background.

When the brighter luminance of light emitted from the light emitting material becomes available in the future, the light emitting device of the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. Therefore, the light emitting device using the light emitting element of first response speed is highly advantageous.

A portion of the light emitting device that is emitting light consumes power, so it is desirable to display information in such a manner that the light-emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a light emitting device having the configuration in which the structures in Embodiments 1 through 8 are freely combined.

Using a multi-drain transistor, which is a semiconductor element according to the invention, enables to form a circuit, which is difficult to be constructed only with a conventional single drain transistor. Otherwise, a circuit, which can be constructed only with a conventional single drain transistor but becomes complicated or requires large area, can be provided without such disadvantage by using a multi-drain transistor.

The current storing circuit according to the invention comprises a writing element and a driving element in either or both of which a multi-drain transistor is used. Therefore, it is useful in simplifying, reducing in the area and highly integrating various circuits requiring a current storing function such as a current signal buffer. Further, the high yield in manufacturing can be expected since the number of devices is small.

In accordance with the light-emitting device in the invention, it is possible by current-driving the luminous element to maintain the current flowing to the luminous element existing in a display device well even in the following cases: the case that the electric resistance of the luminous element depends on ambient temperature; and the case that the voltage-driving of the luminous element lowers the luminous intensity as the time elapses. Maintaining the current flowing to the luminous element well enables the luminous intensity to be kept good. As a result, color shift can be also avoided in a color display device of the type that respective sub-pixels in RGB are separately formed.

Current-driving of the luminous element enables significant difference between pixels in the amount of the current flowing to the luminous element to be prevented from occurring even when a characteristic of the driving element for controlling the current flowing to the luminous element is different between pixels, so that the uneven intensity of a display screen can be also restrained.

Furthermore, the current flowing to the luminous element can be kept at the desired value, so that change of gradation due to potential fall caused by wiring resistance can be prevented. This is also an advantage in comparison with the voltage-driving of the luminous element.

Moreover, in accordance with the light-emitting device of the invention, using a semiconductor element, that is, a multi-drain transistor according to the invention in a pixel circuit enables the area occupied by the pixel circuit to be reduced. As a result, the aperture rate rises, and thereby, the density of the current flowing to the luminous element decreases, so that saving the electric power and stopping deterioration of the luminous element per se can be performed.

In the display device according to the invention, a pixel circuit can also be reduced in the area, highly integrated and highly functionalized since a multi-drain transistor, which is a semiconductor element according to the invention, is used in the pixel circuit.

The electronic devices according to the invention have advantages of high functionality and high reliability since the light-emitting device or a display device according to the invention, which has the characteristics described above, is mounted thereto.

What is claimed is:

1. A display device comprising a pixel provided with a luminous element,
the pixel comprising:
a writing element for selecting input of a video signal in a form of a current value for the pixel; and
a driving element for controlling the amount of electric current flowing to the luminous element,
wherein the writing element comprises a first semiconductor element, and the driving element comprises a second semiconductor element,
wherein the first semiconductor element of the writing element is a field effect transistor type of a semiconductor element comprising a first gate electrode, a first source electrode and a plurality of first drain electrodes,
wherein the second semiconductor element of the driving element is a field effect transistor type of a semiconductor element comprising a second gate electrode, a second source electrode and a plurality of second drain electrodes,
wherein the first source electrode is electrically connected to a source signal line, one of the plurality of first drain electrodes is directly connected to one of the plurality of second drain electrodes, and the other of the plurality of first drain electrodes is electrically connected to the second gate electrode.

2. An electronic device comprising the display device according to claim 1, wherein the electronic device is selected from the group consisting of an OLED display device, a digital still camera, a lap-top computer, a mobile computer, a portable image reproduction apparatus, a goggle type display, a video camera, and a mobile telephone.

3. A display device comprising a pixel provided with a luminous element,
the pixel comprising:
a writing element for selecting input of a video signal in a form of a current value for the pixel and
a driving element for controlling the amount of electric current flowing to the luminous element and for operating in a saturable region, and
a capacitance element for keeping a gate voltage of the driving element, wherein the writing element comprises a first semiconductor element and the driving element comprises a second semiconductor element, wherein the first semiconductor element is a field effect transistor type of a semiconductor element comprising a first gate electrode, a first source electrode and a plurality of first drain electrodes, wherein the second semiconductor element is a field effect transistor type of a semiconductor element comprising a second gate electrode, a second source electrode and a plurality of second drain electrodes, and wherein the first source electrode is electrically connected to a source signal, one of the plurality of first drain electrodes is directly connected to one of the plurality of second drain electrodes, and the other of the plurality of first drain electrodes is electrically connected to the second gate electrode.

4. A light-emitting device comprising a pixel provided with a luminous element, the pixel comprising:

a writing element for selecting input of a video signal in a form of a current value for the pixel;

a driving element for controlling the amount of electric current flowing to the luminous element; and wherein a first semiconductor element is used in the writing element, wherein the first semiconductor element is a field effect transistor type of a semiconductor element comprising a first gate electrode, a first source electrode and a plurality of first drain electrodes, wherein a second semiconductor element is used in the driving element, wherein the second semiconductor element is a field effect transistor type of a semiconductor element comprising a second gate electrode, a second source electrode and a plurality of second drain electrodes, and wherein the first source electrode is electrically connected to a source signal line, one of the plurality of first drain electrodes is directly connected to one of the plurality of second drain electrodes, and the other of the plurality of first drain electrodes is electrically connected to a capacitance element.

5. An electronic device comprising the light-emitting device according to claim 4, wherein the electronic device is selected from the group consisting of an OLED display device, a digital still camera, a lap-top computer, a mobile computer, a portable image reproduction apparatus, a goggle type display, a video camera, and a mobile telephone.

6. A light-emitting device comprising a pixel provided with a luminous element, the pixel comprising:

a writing element for selecting input of a video signal in a form of a current value for the pixel; and a driving element for controlling the amount of electric current flowing to the luminous element and for operating in a saturable region;

wherein a first semiconductor element is used in the writing element, wherein the first semiconductor element is a field effect transistor type of a semiconductor element comprising a first gate electrode, a first source electrode and a plurality of first drain electrodes, wherein a second semiconductor element is used in the driving element, wherein the second semiconductor element is a field effect transistor type of a semiconductor element comprising a second gate electrode, a second source electrode and a plurality of second drain electrodes, and wherein the first source electrode is electrically connected to a source signal line, one of the plurality of first drain electrodes is directly connected to one of the plurality of second drain electrodes, and the other of the plurality of first drain electrodes is electrically connected to the second gate electrode and a capacitance element.

7. A light-emitting device comprising a pixel provided with a luminous element, the pixel comprising:

a writing element for selecting input of a video signal in a form of a current value for the pixel;

a driving element for controlling the amount of electric current flowing to the luminous element;

a capacitance element for keeping a gate voltage of the driving element; and an initializing element for selecting release of electric charge kept in the capacitance element, wherein a first semiconductor element is used in the writing element, wherein the first semiconductor element is a field effect transistor type of a semiconductor element comprising a first gate electrode, a first source electrode and a plurality of first drain electrodes, wherein a second semiconductor element is used in the driving element, wherein the second semiconductor element is a field effect transistor type of a semiconductor element comprising a second gate electrode, a second source electrode and a plurality of second drain electrodes, and wherein the first source electrode is electrically connected to a source signal line, one of the plurality of first drain electrodes is directly connected to one of the plurality of second drain electrodes, and the other of the plurality of first drain electrodes is electrically connected to the capacitance element and a source electrode of the initializing element.

8. The light-emitting device according to claim 7, further comprising:

a writing gate signal line; and an initializing gate signal line, wherein the first gate electrode is connected to the writing gate signal line, and wherein a gate electrode of the initializing element is connected to the initializing gate signal line.

9. A light-emitting device comprising a pixel provided with a luminous element, the pixel comprising:

a writing element for selecting input of a video signal in a form of a current value for the pixel;

a driving element for controlling the amount of electric current flowing to the luminous element and for operating in a saturable region;

a capacitance element for keeping a gate voltage of the driving element; and an initializing element for selecting release of electric charge kept in the capacitance element, wherein a first semiconductor element is used in the writing element, wherein the first semiconductor element is a field effect transistor type of a semiconductor element comprising a first gate electrode, a first source electrode and a plurality of first drain electrodes, wherein a second semiconductor element is used in the driving element, wherein the second semiconductor element is a field effect transistor type of a semiconductor element comprising a second gate electrode, a second source electrode and a plurality of second drain electrodes, and wherein the first source electrode is electrically connected to a source signal line, one of the plurality of first drain electrodes is directly connected to one of the plurality of second drain electrodes, and the other of the plurality of first drain electrodes is electrically connected to the capacitance element and a source electrode of the initializing element.

10. A light-emitting device comprising a pixel provided with a luminous element, the pixel comprising:

a writing element comprising a channel forming region and a plurality of impurity regions;

a driving element comprising a channel forming region and three impurity regions;

an initializing element; and a capacitance element, wherein a first impurity region of the plurality of impurity regions included in the writing element is connected to a source signal line, a second impurity region of the plurality of impurity regions is connected to either a source region or a drain region of the initializing element and a third impurity region of the plurality of impurity regions is connected to a first impurity region selected from the three impurity regions of the driving element via a wiring, wherein one of the source region and the drain region of the initializing element is connected to a power supply line and the other of the source region and the drain region is connected to the second impurity region selected from the plurality of impurity regions included in the writing element, and wherein a second impurity region of the three impurity regions included in the driving element is connected to the power supply line, a third impurity region of the three impurity regions included in the driving element is connected to a pixel electrode of the luminous element.

11. An electronic device comprising the light-emitting device according to claim 10, wherein the electronic device is selected from the group consisting of an OLED display device, a digital still camera, a lap-top computer, a mobile computer, a portable image reproduction apparatus, a goggle type display, a video camera, and a mobile telephone.

12. A light-emitting device comprising a pixel provided with a luminous element, the pixel comprising:

a writing element comprising a channel forming region and a plurality of impurity regions;

a driving element comprising a channel forming region and three impurity regions;

an initializing element; and a capacitance element, wherein a first impurity region of the plurality of impurity regions included in the writing element is connected to a source signal line, a second impurity region of the plurality of impurity regions in the writing element is connected to either a source region or a drain region of the initializing element and a third impurity region of the plurality of impurity regions is connected to a first impurity region selected from the three impurity regions of the driving element via a wiring, wherein one of the source region and the drain region of the initializing element is connected to a power supply line and the other of the source region and the drain region is connected to the second impurity region selected from the plurality of impurity regions included in the writing element, and wherein a second impurity region of the three impurity regions included in the driving element is connected to the power supply line, a third impurity region of the three impurity regions included in the driving element is connected to a pixel electrode of the luminous element, and wherein the driving element is configured to operate in a saturable region.

13. An electronic device comprising the light-emitting device according to claim 12, wherein the electronic device is selected from the group consisting of an OLED display device, a digital still camera, a lap-top computer, a mobile computer, a portable image reproduction apparatus, a goggle type display, a video camera, and a mobile telephone.

14. The light-emitting device according to claim 12, wherein a channel length of a first drain channel of the driving element is equal to a channel length of a second drain channel of the driving element, and wherein a channel width of the first drain channel is equal to a channel width of the second drain channel.

15. The light-emitting device according to claim 12, wherein a channel length of a first drain channel of the driving element is different from a channel length of a second drain channel of the driving element, and wherein a channel width of the first drain channel is different from a channel width of the second drain channel.

* * * * *

UNITED STATES PATENT AND TRADEMARK OFFICE
CERTIFICATE OF CORRECTION

PATENT NO. : 9,117,913 B2  
APPLICATION NO. : 12/627429  
DATED : August 25, 2015  
INVENTOR(S) : Kazutaka Inukai It is certified that error appears in the above-identified patent and that said Letters Patent is hereby corrected as shown below:

In the Specification:

Col. 2, line 26, "OLED devices, decrease" should read --OLED devices decrease--

Col. 2, line 29, "in the ease that" should read --in the case that--

Col. 2, line 65, "condition of 1 =c (V)" should read --condition of I = c (V)--

Col. 9, line 41, "drain current of" should read --drain current $I_{dn}$ of--

Col. 12, line 21, "the writing period. Ta" should read --the writing period Ta--

Col. 24, line 54, "island-like, semiconductor" should read --island-like semiconductor--

Col. 25, line 39, "from 1 to 5 (is" should read --from 1 to 5 μm (is--

Col. 25, line 50, "thickness of 150 mm" should read --thickness of 150 nm--

Col. 25, line 62, "FIG. 121)," should read --FIG. 12D,--

Col. 26, line 20, "organic Light emitting" should read --organic light emitting--

Col. 26, line 52, "uses MgAg for, the" should read --uses MgAg for the--

Col. 27, line 23, "current through channel" should read --current through a channel--

Col. 28, line 29, "shown in the FIG." should read --shown in the figure)--

Col. 28, line 52, "electrode. 4203." should read --electrode 4203.--

Signed and Sealed this  
Twenty-third Day of February, 2016

Michelle K. Lee  
*Director of the United States Patent and Trademark Office*